United States Patent
Prestros

(10) Patent No.: US 7,417,576 B2
(45) Date of Patent: Aug. 26, 2008

(54) METHOD AND APPARATUS FOR DETECTING AN EDGE

(75) Inventor: Ralph Prestros, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/598,222

(22) Filed: Nov. 10, 2006

(65) Prior Publication Data

US 2008/0122426 A1    May 29, 2008

(30) Foreign Application Priority Data

Nov. 3, 2006   (DE)  .................. 10 2006 051 984

(51) Int. Cl.
   *H03M 1/34*   (2006.01)
(52) U.S. Cl. .................. 341/164; 341/155; 341/158
(58) Field of Classification Search .................. 341/164
   See application file for complete search history.

(56) References Cited

U.S. PATENT DOCUMENTS

| 4,707,666 | A | 11/1987 | Pfeifer et al. |
| 5,272,725 | A | 12/1993 | Jones et al. |
| 5,296,856 | A * | 3/1994 | Mantong .................. 341/139 |
| 6,404,372 | B1 | 6/2002 | Heithoff |
| 6,492,929 | B1 * | 12/2002 | Coffey et al. .................. 341/155 |
| 6,665,359 | B1 | 12/2003 | Flake |

FOREIGN PATENT DOCUMENTS

DE   197 32 960 A1   2/1999

* cited by examiner

*Primary Examiner*—Khai M Nguyen
(74) *Attorney, Agent, or Firm*—Maginot, Moore & Beck

(57) ABSTRACT

A detector comprises an analog-to-digital converter. The analog-to-digital converter comprises an input for an analog receive signal and an output for a digital signal. The detector further comprises an edge detector. The edge detector comprises an input for a digital signal and an interface for an edge detection information. The edge detection information indicates the presence of an edge, if the digital signal indicates a change which is larger than or equal to a change threshold value.

29 Claims, 13 Drawing Sheets

METHOD AND APPARATUS FOR DETECTING AN EDGE

BACKGROUND OF THE INVENTION

The present invention is generally related to a detector, an apparatus for processing a signal and a method for processing a signal.

In a plurality of applications, a signal representing a digital content is transported over a channel. On a receiver side, it is desired to reconstruct the digital signal from the analog signal.

There are signals in which a position of an edge or of a transition in the analog signal is required for reconstructing a data content represented by the analog signal. Moreover, there are also numerous other applications which require the detection of a transition or an edge in an analog signal.

BRIEF SUMMARY OF THE INVENTION

At least some embodiments of the present invention include a detector. The detector comprises an analog-to-digital converter comprising an input for an analog receive signal and an output for a digital signal. The detector further comprises an edge detector comprising an input for the digital signal and an interface for an edge detection information, wherein the edge detection information indicates the presence of an edge, if the digital signal indicates a change which is larger than or equal to a change thresh value.

BRIEF DESCRIPTION OF THE DRAWINGS

Preferred embodiments of the present invention will subsequently be described taking reference to the enclosed figures, in which

FIG. 2b shows a block schematic diagram of the threshold value calibrator of FIG. 2a;

DETAILED DESCRIPTION OF THE INVENTION

Figure 1:
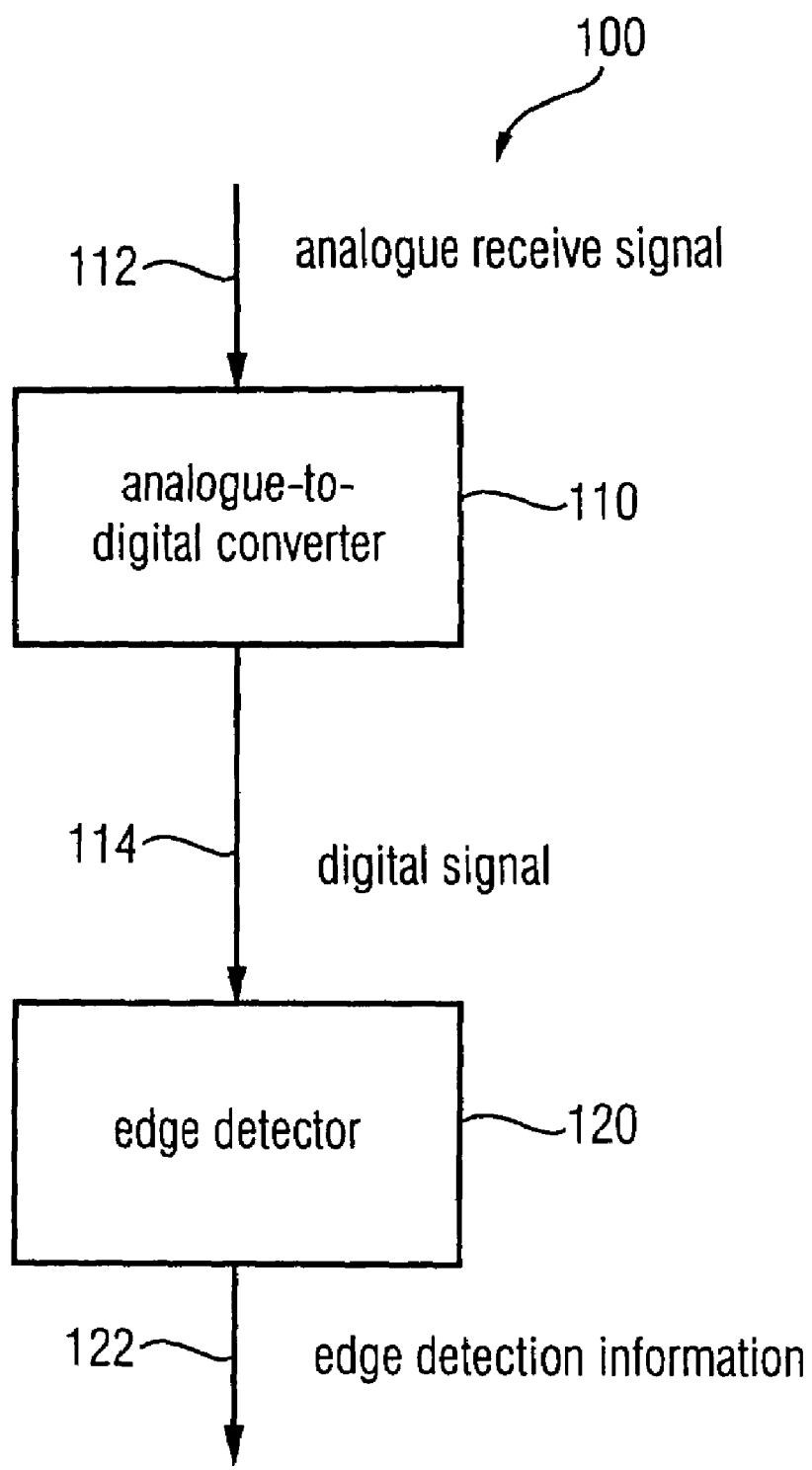
FIG. 1 shows a block schematic diagram of an inventive detector, according to a first embodiment of the present invention.

FIG. 1 shows a block schematic diagram of an inventive detector, according to an embodiment of the present invention. The detector of FIG. 1 is designated in its entirety with 100.

The detector 100 of FIG. 1 comprises an analog-to-digital converter 110. The analog-to-digital converter 110 comprises an input for an analog receive signal 112 and an output for a digital signal 114.

The detector 100 further comprises an edge detector 120. The edge detector 120 comprises an input for the digital signal 114 and an interface (or output) for an edge detection information 122. The edge detection information indicates the presence of an edge if the digital signal indicates a change which is larger than or equal to a given change threshold value.

The usage of an analog-to-digital converter 110 in combination with the edge detector 120 brings along the advantage that a digital edge detection algorithm can be applied for detecting an edge on the basis of a change of the analog receive signal. For this purpose, the change threshold value can be given in a digital form, thus allowing for the application of an algorithm to calibrate the change threshold value. Moreover, this configuration allows for a separation of edges from overshoot events or undershoot events. Thus, higher reliability of the edge detection can be achieved, even in the present of a difficult detection environment.

The use of the edge detector 120 connected to the output of the analog-to-digital converter 110 brings along the advantage that the need for error-prone and difficult to fabricate analog circuitry is strongly reduced. Edge detection and overshoot suppression can both be performed in the digital domain, where non-linear and time-variant algorithms can be applied more easily when compared to an analog signal processing.

Also, the need for an analog differentiator is cancelled making use of the digital signal processing, so that noise is reduced with respect to conventional circuits.

Moreover, the inventive concept of using an analog-to-digital converter 110 and the digital edge detector 120 can easily be realized using a low cost CMOS process for a digital circuit and for the analog-to-digital converter.

Figure 2:
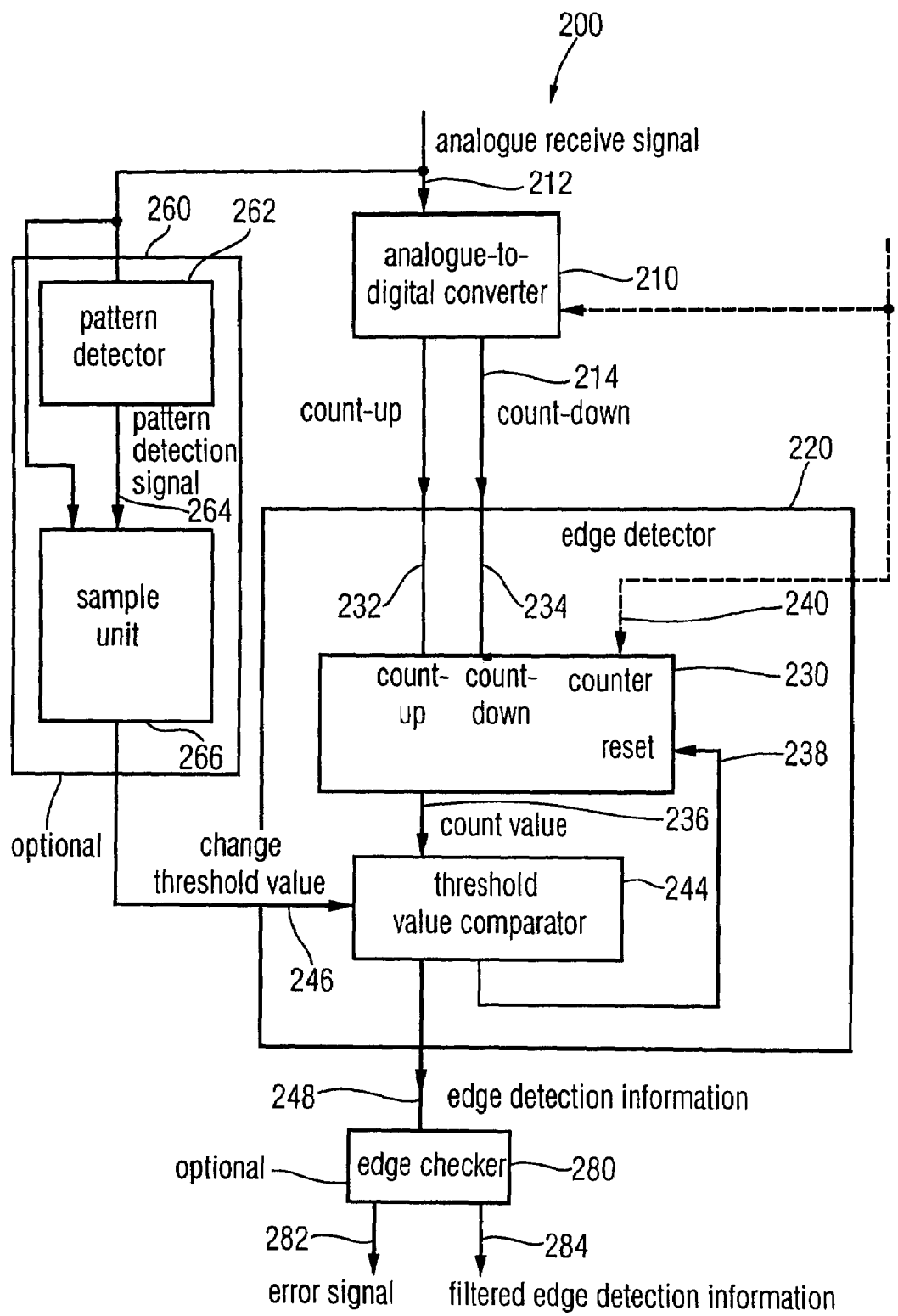
FIG. 2 shows a block schematic diagram of an inventive detector, according to second embodiment of the present invention.

In the following, an extended embodiment of the present invention will be described taking reference to FIG. 2. FIG. 2 shows a block schematic diagram of an inventive detector, according to an embodiment of the present invention. The detector of FIG. 2 is designated in its entirety with 200.

It should be noted here that the detector 200 of FIG. 2 comprises a number of optional means or function blocks. It should be noted here that any details or blocks exceeding a functionality as described with reference to FIG. 1 should be considered to be optional. The optional blocks can be combined arbitrarily in order to achieve a particular advantageous implementation.

The detector 200 comprises an analog-to-digital converter 210. The analog-to-digital converter 210 comprises an input for receiving an analog receive signal 212. Moreover, the analog-to-digital converter 210 comprises an output for providing a count-up/count-down information 214.

In a preferred embodiment, the count-up/count-down information 214 indicates a count-up condition, if the analog receive signal processed in a current time interval lies within a higher analog-to-digital converter interval when compared to an analog receive signal in a previous time interval. On the other hand, the count-up/count-down information indicates a count-down condition, if the analog receive signal processed in a current time interval lies within a lower analog-to-digital converter interval when compared to an analog receive signal processed in a pervious time interval. In other words, the count-up/count-down information indicates whether the analog receive signal of the present (current) time interval has increased or decreased with respect to the analog receive signal processed in the previous time interval.

In an alternative embodiment, the count-up/count-down information may indicate whether the analog receive signal of the current time interval is larger than a current reference value of the analog-to-digital converter or smaller than a current reference value of the analog-to-digital. In this case, the count-up/count-down information may indicate in which way the reference value of the analog-to-digital the is to be changed with respect to the current reference value.

In general, the count-up/count-down information 214 constitutes a representation of a digital output signal of the analog-to-digital converter 210 in terms of increments (count-up conditions) and decrements (count-down conditions) with reference to previous time intervals.

The detector 200 further comprises an edge detector 220, which may basically fulfill the function of the edge detector 120. The edge detector 220 receives the count-up/count-down information 214, which may fulfill the function of the digital signal 114.

The edge detector 220 comprises a counter 230. The counter 230 comprises a count-up input for receiving the count-up information 232 and count-down input for receiving the count-down information 234. The count-up information 232 and the count-down information 234 are both part of the count-up/count-down information 214.

To summarize the above, the counter 230 can be assumed to have a count-up/count-down input to receive the count-up/count-down information 214. The counter 230 further comprises an output for a count value 236. The counter 230 is adapted to increase or decrease the counter value 236 in dependence on the count-up/count-down information 214. The counter 230 further comprises a reset input for receiving a reset signal 238, the function of which will be described in the following.

Moreover, the counter optionally comprises a clock input for an optional clock signal 240. If the clock signal 240 is used, the counter 230 may change its count value 236 in response to the clock signal 240 and in dependence on the count-up/count-down information 214. In other words, the count-up/count-down information 214 determines whether the counter 230 counts upward, counts downward or keeps its previous count value, when the clock signal 214 is activated (e.g. comprises a rising or falling edge).

The edge detector 220 further comprises a threshold value comparator 244. The threshold value comparator 244 comprises a count value input for receiving the count value 236 from the counter 230. The threshold value comparator 244 further comprises an optional input for a change threshold value 246. Besides, the threshold value comparator comprises a reset output to provide the reset signal 238 to the counter 230. Moreover, the threshold value comparator 244 comprises an edge detection information output for providing an edge detection information 248.

It should be noted that the change threshold value 246 may optionally be provided by an input of the threshold value comparator 244. Alternatively, the change threshold value 246 may be a fixed value, which is incorporated in the threshold value comparator, for example in a storage of the threshold value comparator 244. In this case the threshold value input of the threshold value comparator 244 can be omitted.

Following the above structural description, the functionality of the edge detector 220 will subsequently be described. It should be noted that the counter 230 receives the count-up information 232 and the count-down information 234 (summarized as the count-up/count-down information 214). Thus, when the analog-to-digital converter 210 indicates that the count-up condition has occurred, the value of the counter 230 is increased, unless the counter 230 receives an active reset signal 238. On the other hand, when the analog-to-digital converter 210 issues an active count-down information 234, the count value 236 of the counter 230 is decreased, unless the reset signal 238 is active. Thus, the counter 230 may effectively follow an increases and/or a decrease of the analog receive signal 212, unless the reset signal 238 is active.

Besides, there may be a condition that the analog-to-digital converter 210 neither provides an active count-up signal 232 nor an active count-down signal 234. In this case, the counter value 236 of the counter 230 preferably remains constant. The threshold value comparator 244 receives the count value 236 from the counter 230 and compares the count value 236 with the change threshold value 246. The described comparison between the count value 236 and the change threshold value 246 is performed independent on whether the change threshold value is provided to the threshold value comparator 244 via an input, or whether the change threshold value 246 is stored within the threshold value comparator 244. Moreover, when the threshold value comparator 244 recognizes that the count value 236 reaches or exceeds the change threshold value 246, the threshold value comparator 244 activates the reset signal 238. Upon activation of the reset signal 238, the counter 230 is reset (or preset) to a predetermined initial value or reset value or preset value.

Moreover, the threshold value comparator 244 is adapted to provide an active edge detection information 248 upon detection that the count value 236 reaches or exceeds the change threshold value 246. In other words, the threshold value comparator 244 recognizes and indicates the presence of an edge, when the count value 236 reaches or exceeds the change threshold value 246.

It should be noted that the change threshold value 246 may in a preferred embodiment comprise two values, a first of which is larger than the predetermined initial value, to which the counter 230 is reset (or preset) upon activation of the reset signal 238, and a second of which is smaller than the predetermined initial value, to which the counter 230 is reset (or preset) upon activation of the reset signal 238. In this way, the threshold value comparator 244 detects when the counter 230 has counted upwards a predetermined number of steps (the number of steps being determined by the first change threshold value) starting from the starting value or the preset value. In addition, the threshold comparator 244 detects, when the counter 230 has counted downwards a given number of steps (the number of steps being determined by the second change threshold value) starting from the starting value of the preset value.

In the preferred embodiment, the threshold value comparator 244 provides an information about a first edge type, e.g. about a rising edge, when the counter value 236 reaches or exceeds the first change threshold value. Moreover, in the preferred embodiment, the threshold value comparator 244 indicates a second edge type, e.g. a falling edge, when the count value 236 of the counter 230 reaches or falls below the second change threshold value.

In the preferred embodiment, the threshold value comparator 244 activates the reset signal 238 whenever the threshold value comparator 244 detects a falling edge or a rising edge. Thus, the counter 230 is reset whenever a falling edge or a rising edge is detected, i.e. when the edge detection information 248 indicates a falling edge or a rising edge.

Consequently, the present invention brings along the advantage that the counter 230 is set to a well-defined value whenever a rising edge or a falling edge is detected. Thus, after the detection of an edge, the state of the counter 230 is well-known. Also, based on the fact that the initial state or initial value or starting value of the counter 230 is known after the occurrence of an edge, the detection of a subsequent edge can be performed after a predetermined number of counting steps.

The present invention also brings along the advantage that the counter 230 only needs to comprise a very limited counting range. The range of the counter 230 can be limited to the maximum value of the change threshold value, which is typically smaller than a maximum amplitude of the signal.

Moreover, edge detection becomes particularly reliable, as the counter is always reset upon the detection of an edge. Thus, in an embodiment of the present invention, the analog receive signal 212, which is present when an edge is detected, serves as a reference value (or as the starting value of the counter 230) for the detection of a subsequent edge.

Moreover, it should be noted that the structure described above brings along the advantage that the threshold value comparator 244 can be implemented in a particularly advantageous way. This is due to the fact that the counter 230 is applied for the edge detection. The usage of a counter in one embodiment of the present invention ensures that the count value 236 only changes by one step (or by one bit) between a previous time interval and a subsequent time interval. Thus, it is ensured that even in the presence of a steep edge, the count value 236 takes a number of consecutive values. Thus, the threshold value comparator 244 may be adapted to identify an identity between the count value 236 and the first change threshold value and/or the second change threshold value, rather than relying upon the identification of a "greater than" condition, a "greater than or equal" condition, a "smaller than" condition or a "smaller than or equal" condition, which would need to be evaluated in the absence of the counter in order to account for possible 2-bit changes of a conventional analog-to-digital converter. Thus, the threshold value comparator 244 may, in one embodiment, comprise a particularly simple structure and/or a particularly low power consumption.

In another preferred embodiment of the present invention, the detector 200 may be supplemented by an (optional) change-threshold-value calibrator 260. The optional change-threshold-value calibrator 260 comprises a receive signal input for the receive signal 212 and a change threshold value output for the change threshold value 246. In other words, the receive signal input of the change-threshold-value calibrator 260 is adapted to receive the analog receive signal 212. Moreover, the output of the change-threshold-value calibrator 260 is coupled to the change threshold value input of the threshold value comparator 244.

Thus, the change-threshold-value calibrator 260 is adapted to provide at least one change threshold value 246 to the threshold value comparator 244. However, in a preferred embodiment the change-threshold-value calibrator 260 is adapted to provide at least two threshold values, namely the first change threshold value and the second change threshold value, to the threshold value comparator threshold value comparator 244.

In general, the change-threshold-value calibrator 260 is adapted to provide the change threshold value 246 (e.g. the first change threshold value and the second change threshold value) as a function of a difference between a value of the receive signal 212 at a first time of a predetermined signal pattern and a value of the receive signal 212 at a second time of a predetermined signal pattern. Moreover, the change threshold value 246 provided by the change-threshold-value calibrator 260 is preferably a predetermined fraction of a difference between the value of the analog receive signal 212 at the first time and the value of the receive signal 212 at the second time.

In the following, a possible structure of the change-threshold-value calibrator 260 will be described.

In a preferred embodiment, the threshold-value calibrator 260 comprises a pattern detector 262. The pattern detector 262 has an input for receiving the analog receive signal 212 and an output for providing a pattern detection signal 264. In the preferred embodiment, the pattern detection signal 264 indicates, when a predetermined signal pattern is contained (or detected) in the analog receive signal 212.

The sample unit 266 of the threshold-value calibrator 260 comprises an input to receive the pattern detection signal 264. The sample unit 266 further comprises an input for receiving the analog receive signal 212. Moreover, the sample unit 266 has an output for providing the change threshold value 246.

In the preferred embodiment of the present invention, the pattern detector 262 is adapted to activate the pattern detection signal 264 upon detection of the predetermined signal pattern in the analog receive signal 212. In response to the activation of the pattern detection signal 264, the sample unit samples the analog receive signal 212 at a first instance of time and at a second instance of time. A temporal difference between the first instance of time and the second instance of time is typically predetermined.

In a preferred embodiment, the predetermined pattern, which is applied by the pattern detector 262, and the time difference between the first time and the second time is preferably chosen such that the analog receive signal 212 is in a first settled state at the first time and in a second settled state at the second time. In the preferred embodiment, the first settled state is a state in which the analog receive signal 212 describes a first logic state (e.g. a logic "0") and the second settled state is a state in which the analog receive signal 212 describes a second logic state (e.g. a logic "1").

In general, it is preferred that the difference between the value of the analog receive signal 212 at the first time and the value of the analog receive signal 212 at the second time describes a modulation depth of the analog receive signal 212, the modulation depth describing a level difference between a first settled state of the analog receive signal 212 and a second settled state of the analog receive signal 212. It should be noted that the modulation depth typically does not comprise an overshoot amplitude.

Moreover, in a preferred embodiment the sample unit 266 is adapted to provide as the change threshold value 246 a value representing a fraction of the modulation depth. In an embodiment, the change threshold value 246 provided by the sample unit 266 represents a change of the analog receive signal 212 between 20% of the modulation depth and 80% of the modulation depth. However, it is preferred that the change threshold value 246 represents a change of the analog receive signal 212 between 40% of the modulation depth and 60% of the modulation depth.

In other words, if it is assumed that the counter 230 would change by n steps, if the analog receive signal 212 changes by a value which is identical to the modulation depth, the sample unit 266 provides a change threshold value, which corresponds to a change of the count value 236 between 0.2× and 0.8× (or between 0.4× and 0.6×, in another embodiment).

Figure 3:
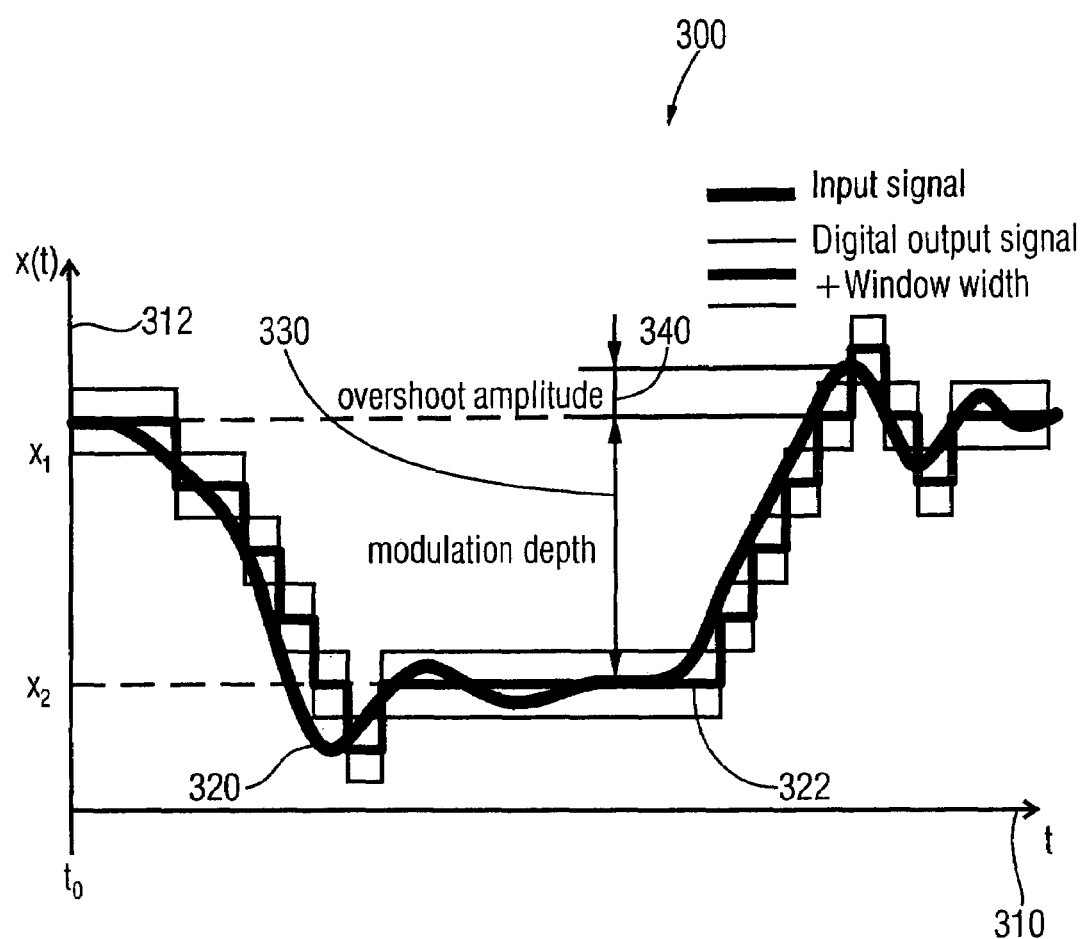
FIG. 3 shows a graphical representation of an analog receive signal.

Taking a reference to FIGS. 3 and 4, and their functionality to the threshold-value calibrator 260, will be explained in more detail. For this purpose, FIG. 3 shows a graphical representation of an exemplary analog receive signal 212. The graphical representation of FIG. 3 is designated in this entirety with 300.

An abscissa 310 describes a time in terms of arbitrary units, and an ordinate 312 describes a value of the analog input signal 212 in terms or arbitrary units. A first temporal curve 320 describes a temporal evolution of the value of the input signal. Moreover, a second curve 322 describes a temporal evolution of a digital output signal representing the input signal 212.

It should be noted here that FIG. 3 shows a modulation depth 330 as the difference between a first steady state value (or settled value) $x_1$ of the input signal 212 and a second steady state value (or settled value) $x_2$ of the input signal 212. It should be noted, that the first steady state value $x_1$ is a value at which the input signal 212 settles, when the input signal is in a first state for a sufficiently long time. Moreover, the second steady state value $x_2$ describes a value at which input signal 212 settles, when the input signal 212 is in a second state for a sufficiently long time.

Moreover, the graphical representation 300 shows an overshoot amplitude 340. The overshoot amplitude 340 is, for example, defined as the difference between a maximum value (or overshoot-value) of the input signal 212 and the first steady state value $x_1$. In other words, the overshoot amplitude 340 defines, by which value the input signal 212 exceeds the first steady state value $x_1$.

Alternatively, the overshoot amplitude could also be defined as a difference between the second steady state value $x_2$ and a minimum value that the input signal 212 reaches.

Figure 4:
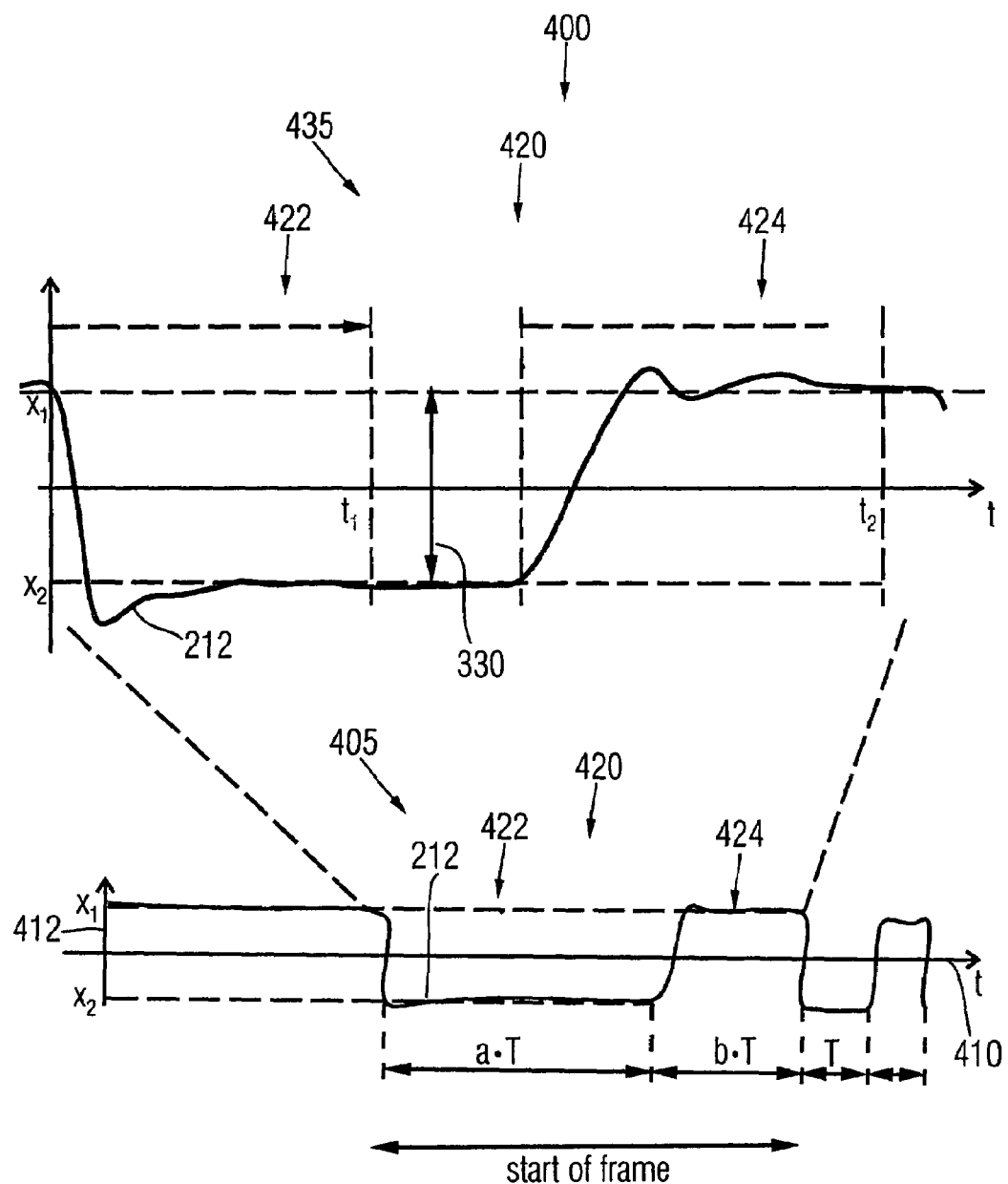
FIG. 4 shows another graphical representation on an analog receive signal.

FIG. 4 shows a graphical representation of a temporal evolution of the input signal 212 comprising a start-of-frame pause, which may be used for a calibration of the threshold value by the threshold-value calibrator 260. The graphical representation of FIG. 4 is designated in its entirety with 400. A first graphical representation 405 shows the input signal 212 in a first time scale. An abscissa 410 describes a time, while an ordinate 412 describes a value of the input signal. It should be noted that the input signal 412 changes between a first (steady state) state value $x_1$ and a second steady state second (steady state) value x2 in dependence on data to be transmitted. It should be noted that changes between the first steady state value x1 and second value $x_2$ are accompanied by a certain degree of overshoot. It should also be noted that the duration of an information bit to be transported by the analog input signal 212 shown in the graphical representation of FIG. 4 is designated with T.

The graphical representation of FIG. 4 shows a start of frame pause 420. The start of frame pause 420 comprises a first portion 422 wherein the input signal 212 takes the second steady state value x2 (or a value approximating the second steady state value $x_2$) for a time a*T. The start-of-frame pause 220 further comprises a second portion 424, during which the input signal 212 takes the first value $x_1$ for a time b*T. Thus, the start of frame pause 420 in the embodiment of the present invention has a total duration of (a+b)*T, with T being the duration of one information bit. In a preferred embodiment, the first portion 422 of the start-of-frame pause has a duration between 5*T and 15*T, and preferably between 10*T and 11*T, according to ISO/IEC 14443-3, type B. The second portion 424 of the starter frame pause has a duration between 2*T and 15*T, and preferably between 2*T and 3*T, according to ISO/IEC 14443-3, type B. However, for the operation of the present invention, a minimum duration of the first portion 422 of 2*T and a minimum duration of the second portion 424 of 2*T, is sufficient. For the definition of a start-of-frame pause, a maximum length of the first portion 424 and of the second portion 424 is not of relevance.

FIG. 4 also shows a magnified representation of the input signal 212 during the starter frame pause 420. The magnified representation is designated with 435.

In the magnified representation, it can be seen that the input signal 212 requires a certain amount of time to settle after a transition between the first value $x_1$ and the second value $x_2$, or vice-versa. Thus, there exists a first time $t_1$ when the input signal 212 sufficiently approximates the second value $x_2$. Moreover, there exists a second time $t_2$ when the input signal 212 sufficiently approximates the first value $x_1$ after a transition from the second value $x_2$ to the first value $x_1$. It should be noted that the first time $t_1$ and the second time $t_2$ might be chosen as appropriate sample times for sampling the input signal 412, when the presence of the start of frame sequence 420 is detected. In other words, when the presence of the start-of-frame sequence 420 in the input signal 412 is detected, e.g. by means of the pattern detector 362, the sample unit 266 may take samples of the input signal 212 at the first time $t_1$ and the second time $t_2$.

Thus, the difference between the input signal 212 at the first time $t_1$ and at the second time $t_2$ may be a sufficiently good approximation of the modulation depth 330. Thus, based on the sampling of the input signal 212 at the first time $t_1$ and at the second time $t_2$, the change threshold value 246 can be provided by the sample unit 266 as a value describing a fraction, (e.g. between 20% and 80%) of the modulation depth 330.

In other words, the difference between the signal samples at the first time $t_1$ and at the second time $t_2$ may be used to compute the threshold value 246 as a change of the count value 236, which is caused by a change of the input signal 212 by a fraction (e.g. between 20% and 80%) of the modulation depth 330.

The edge detector 200 may optionally comprise an edge checker 280. The optional edge detector 280 comprises an input for the edge detection information 248 provided by the threshold value comparator 244.

The edge checker 280 also comprises an (optional) output for an error signal and an (optional) second output for a filtered edge detection information. It should be noted here, that the edge checker 280 may either be adapted to provide only the error signal 282, only the filtered edge detection information 284, or both the error signal 282 and the filtered edge detection information 284.

It should also be noted, that in one preferred embodiment, the generation of the error signal 282 and the generation of the filtered edge detection information 284 may be performed independently of each other. However, in another embodiment there may be an interaction between the generation of the error signal 282 and the generation of the filtered edge detection information 284.

In a preferred embodiment, the edge checker 280 is adapted to provide the error signal 284 in such a way that the error signal 284 indicates an error when the edge detection information 284 indicates that two subsequent edges are both rising edges, or both falling edges. In order words, if the edge detection information 284 indicates that the next edge following a rising edge is a rising edge again, the edge checker 280 may activate the error signal. Similarly, the edge checker 280 may activate the error signal 282 if the next edge following a falling edge is also a falling edge.

In contrast, when the next edge following a rising edge is a falling edge, the edge checker 280 may preferably deactivate the error signal 282 (or leave the error signal deactivated). Similarly, when the next edge following a falling edge is a rising edge, the edge checker 280 may deactivate the error signal 282. Thus, the edge checker 280 provides a way of identifying any errors of the edge detection performed by the edge detector 220. Thus, edge detection errors can be recognized, and the error signal 282 may be exploited by a subsequent circuitry in order to perform an appropriate error handling.

In another preferred embodiment, the edge checker 280 is adapted to provide the filtered edge detection information 248 such that the filtered edge detection information is based on the original edge detection information 248, and such that the filtered edge detection information 284 indicates only edges following a predecessor edge of an opposite edge direction. In other words, in a preferred embodiment, the edge checker 280 generates the filtered edge detection information 284 such that the filtered edge detection information 284 comprises information about such edges only, for which the edge detection information 248 indicates that they follow a predecessor edge of the opposite edge direction.

On the other hand, the edge checker 280 preferably does not take over information about edges into the filtered edge detection information 284, the predecessor edge of which is of the same edge type. In other words, if the edge detection information 248 comprises information about a first rising edge and a subsequent second rising edge, without any other edge between the first rising edge the second rising edge, the edge checker 280 does not take over the information about the second rising edge into the filtered edge detection information 284.

Similarly, if the edge detection information 248 comprises an information about a first falling edge and a subsequent falling edge, without another edge in between, the edge checker 280 does not take over the information about the second falling edge into the filtered edge detection information 284. On the other hand, if the edge checker 280 identifies, that a rising edge is a direct successor edge of a falling edge, the edge checker takes over the information describing the rising edge into the filtered edge detection information 284. Further, if the edge checker 280 identifies that a falling edge is the direct successor edge of a rising edge, the edge checker 280 takes over the information regarding the falling edge into the filtered edge detection information 284. To summarize the above, in a preferred embodiment of the invention, the edge checker 280 ensures that the filtered edge detection information 284 comprises an alternating sequence of rising and falling edges, wherein any rising edge is followed by a falling edge, and wherein any falling edge is followed by a rising edge.

In the following, an alternative approach for the calibration of the change threshold value will be described.

Figure 2A:
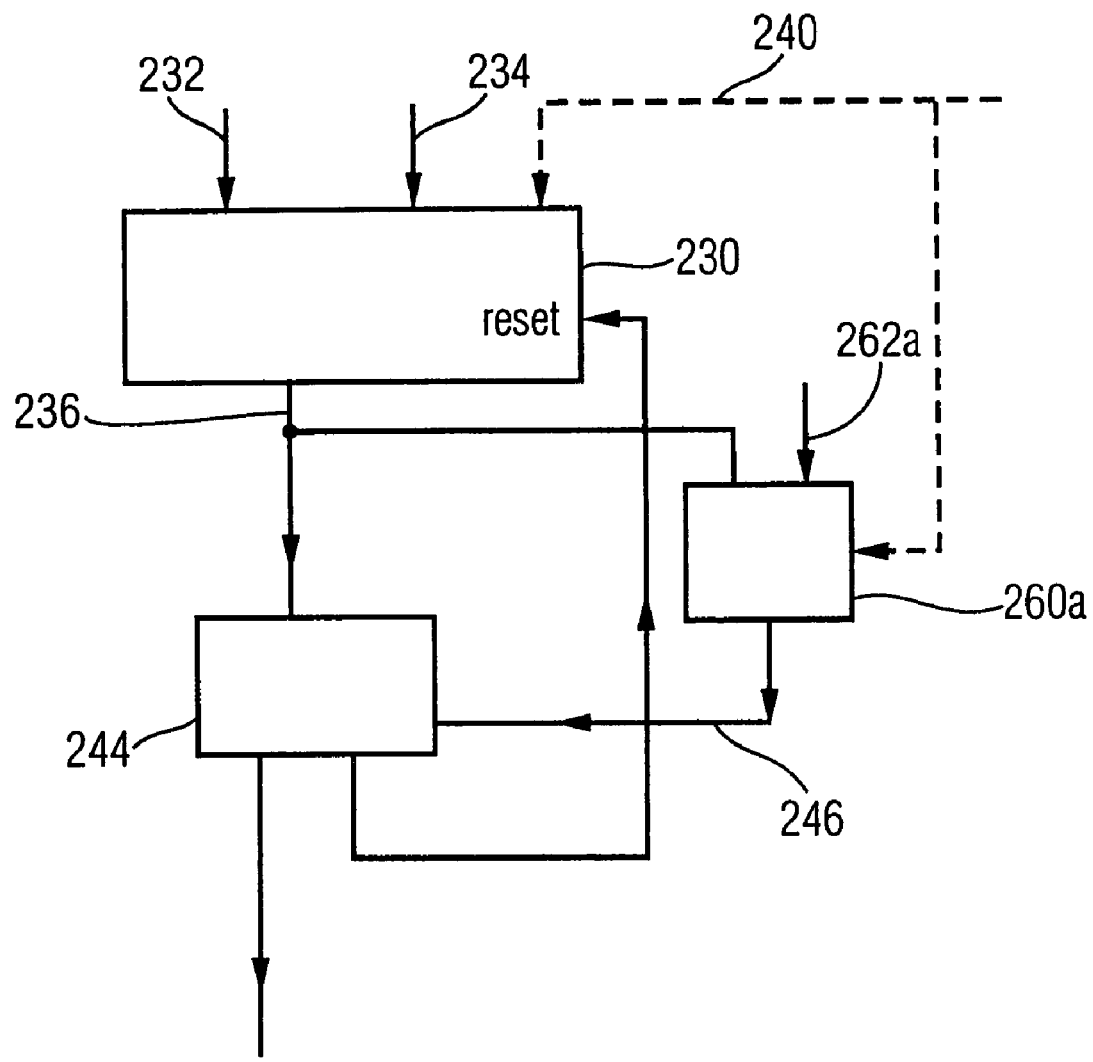
FIG. 2a shows an extract of a block schematic diagram of an inventive detector having a digital threshold value calibrator, according to an embodiment of the present invention.

FIG. 2a shows an extract of a block schematic diagram of an inventive detector comprising an alternative threshold value calibrator. It should be noted that same means and signals are designated with the same reference numbers in FIGS. 2, 2a and 2b.

However, FIG. 2a shows a digital threshold value calibrator 260a which is adapted to use the count value 236 of counter 230. In other words, the digital threshold value calibrator 260a is adapted to use a digital signal for the adjustment of the threshold 246.

It should be noted that the digital threshold value calibrator 260a receives a count value 236 from the counter 230, the clock signal 240 (or a signal derived therefrom) and a reference value 262a, which is equivalent to a reset value of the counter 230. It should be noted that in a calibration mode a reset functionality provided by the threshold value comparator 244 is preferably not active.

Moreover, the threshold value calibrator 260a provides the change threshold value 246 (or two change threshold values).

Figure 2B:
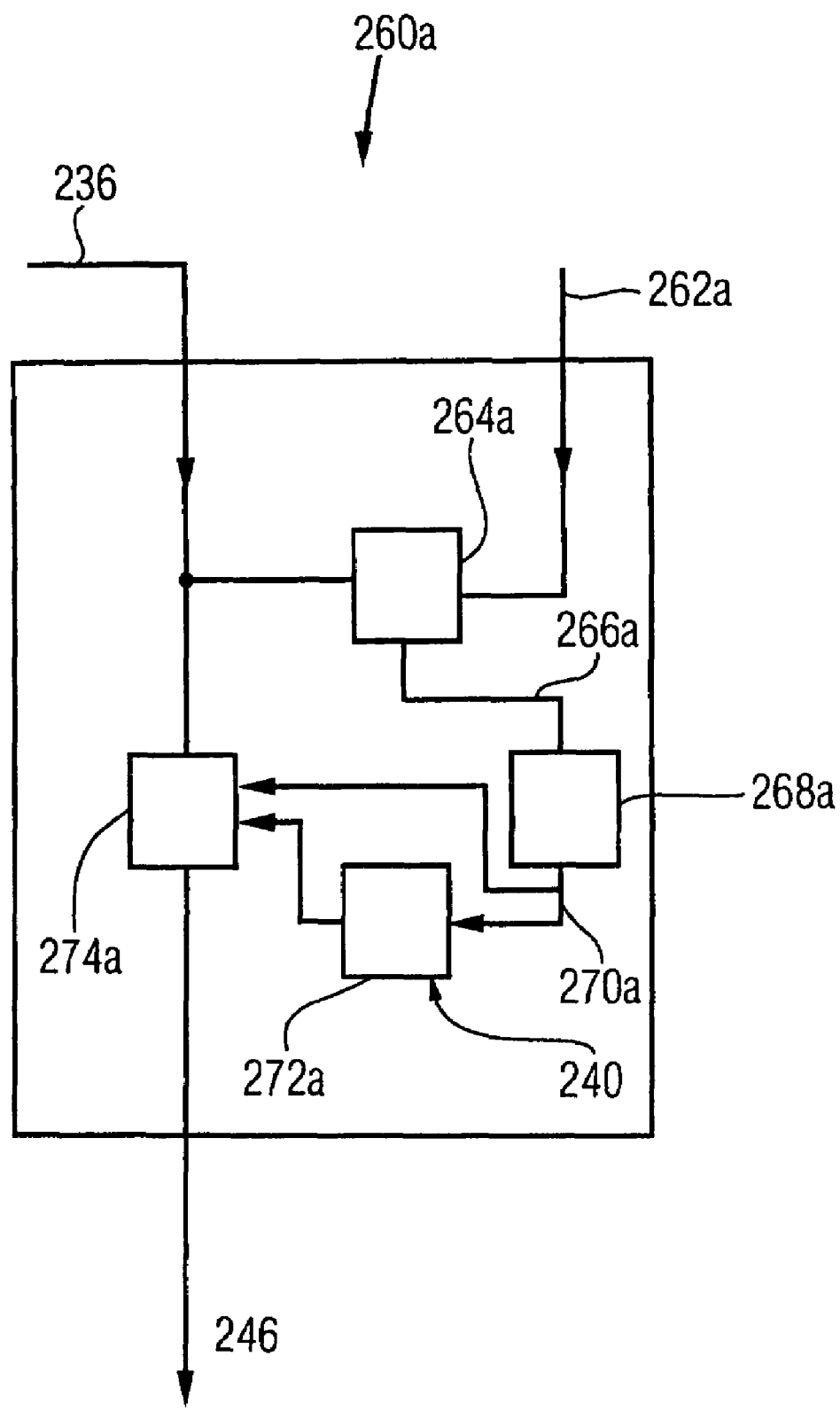

In the following, the possible inner structure of the threshold value comparator 260a according to an embodiment of the present invention will be described taking reference to FIG. 2b. The threshold value comparator 260a comprises a comparator 264a. The comparator 264a receives the count value 236 from the counter 230 and the reference value 262a. Thus, the comparator 264a provides an information 266a indicating whether the count value 236 of the counter 230 is larger or smaller than the reference value 262a. It should be noted that the reference value 262a is chosen such that the information 266a typically takes the first state, when a first logic value (i.e. a logic "0") is transmitted in the analog receive signal 212. Moreover, the information 266a takes a second state, when a second logic value (i.e. a logic "1") is transmitted in the analog receive signal 212. Thus, the information 266a can be used to distinguish whether a logic "0" or a logic "1" is transmitted in the analog receive signal 212.

A change detector 268a further detects, when the state of the information 266a changes. In other words, a change detector 268a detects, when the logic value of the digital information transmitted in the analog receive signal 212 changes. Thus, the change detector 268a provides a change detection signal 270a. The change detection signal 270a indicates, when the value of the analog input signal 212 has changed from a first logic state into a second logic state.

The threshold value calibrator 260a further comprises a counter 272a receiving the clock signal 240. The counter 272a changes its count value by one when a bit duration of a bit in the counter input signal 212 has elapsed. However, the counter 272a is preferably reset whenever the change detector 268 detects a change. Thus, the counter 272a counts, for how many bit durations there has not been a change of a state of the analog input signal 212.

Moreover, the threshold value calibrator 260 comprises a data latch 274a. The data latch 274a is adapted to receive and store the count value 236 provided by the counter 230. Moreover, the latch 274a is coupled to the change detector 268a and to the counter 272a.

The threshold value calibrator 260a comprises logic which is adapted such that a value stored in the latch 274a, which occurs one or two clock periods (or, more generally, a predetermined number of clock periods) before the change detector 268a indicates a change, is used for providing the change threshold value, provided the counter 272a indicates that the comparison result 266a has not changed for a sufficient, predetermined number of clock cycles.

In other words, the threshold value comparator 260a of FIG. 2 is adapted to recognize, if before the occurrence of a change the comparison result 266a has been in a constant state for a sufficiently long time. If at the time, when a change of the comparison result 266a occurs, the comparison result 266a has been in a constant state for a sufficiently long time, a count value 236, which has been generated a predetermined number of clock periods before the occurrence of the change, is used in order to determine the threshold value 246.

In other words, the count value 236, which has been reached the predetermined number of clock periods before the occurrence of a change may be used as the sample value at the first time $t_1$.

Similarly, the sample value at time $t_2$ may be computed making use of the same approach, wherein it should be ensured, that the analog input signal is in different logic states when taking the first sample value and the second sample value.

To summarize the above calibration procedure, it is first determined, if the analog input signal 212 has been in a constant state for a sufficiently long period of time, e.g. for at least a predetermined number of period times T. For this purpose, the counter 272a is used. If a change of the state of the analog input signal 212 occurs after a sufficiently long period of constant state, a counter value 236 of the counter 230 present a predetermined period of time before the change of the state (stored e.g. in the latch 274a) is used in order to derive the change threshold value. To summarize the above description, the present invention as described taking reference to FIGS. 1 and 2, solves the problem of overshoots in amplitude shift keying (ASK) modulated carrier frequency signals. For example, the inventive edge detector may be used in combination with passive RFID systems.

One important advantage of the embodiment of the present invention is the fact that an overshoot problem and a drift problem, which may be present in conventional circuits or systems, can be solved by the inventive digital circuit, if the overshoot amplitude is lower than the modulation depth, and if arbitrary analog-to-digital converts are used for demodulation.

According to a preferred embodiment of the present invention, a digital detection circuit (e.g. the edge detector 120 an the edge detector 220) checks if the analog-to-digital converted input signal (e.g. the digital signal 114) have changed by a specified number of bits (e.g. defined by the threshold value) within a maximum rise time or a maximum fall time for a specified data rate (of data symbols represented by the analog input signal). If this condition is fulfilled, the input signal change is assumed to be an edge of a modulation pause.

According to an embodiment of the present invention, other droops (or transitions) are supposed to be drifts or overshoots or undershoots.

According to an embodiment of the present invention, it can also be tested whether a falling edge is followed by a rising edge, and whether a rising edge is followed by a falling edge (e.g. by means of the edge checker 280). If this is not the case, a demodulation error and/or a detection error, has occurred.

According to another aspect of the present invention, modulation depth decision criteria (e.g. the threshold value 246) are calibrated during a middle of a so-called "start-of-frame" pause, as it is defined in the standard ISO/IEC 14443-3, type B, when it can be expected that all overshoots and undershoots have subsided.

In other words, according to an embodiment of the present invention, a core of the invention is that if the overshoot amplitude is lower than the modulation depth, the overshoots can be distinguished from the pause.

According to some of the above described embodiments, the present invention brings along the following advantages.

a. There is no trade off between overshoot suppression and sensitivity for low modulation indices.

b. The inventive concept brings along higher stability when compared to an analog differentiator and comparator.

c. The inventive concept does not bring along a filter effect of an analog differentiator, and thus does not bring along a spectral noise accentuation.

d. The inventive concept can easily be realized using a low cost CMOS processes for digital circuits.

To summarize the above, the described digital overshoot-resistant detection circuit and an arbitrary analog-to-digital converter (ADC) may fully replace a conventional 10%-demodulator which is sensitive to overshoots and undershoots.

In the following an analog-to-digital converter will be described which may be applied within the above described edge detector. In other words, the analog-to-digital converter described below may replace the analog-to-digital converter 110 or the analog-to-digital converter 210.

Figure 5:
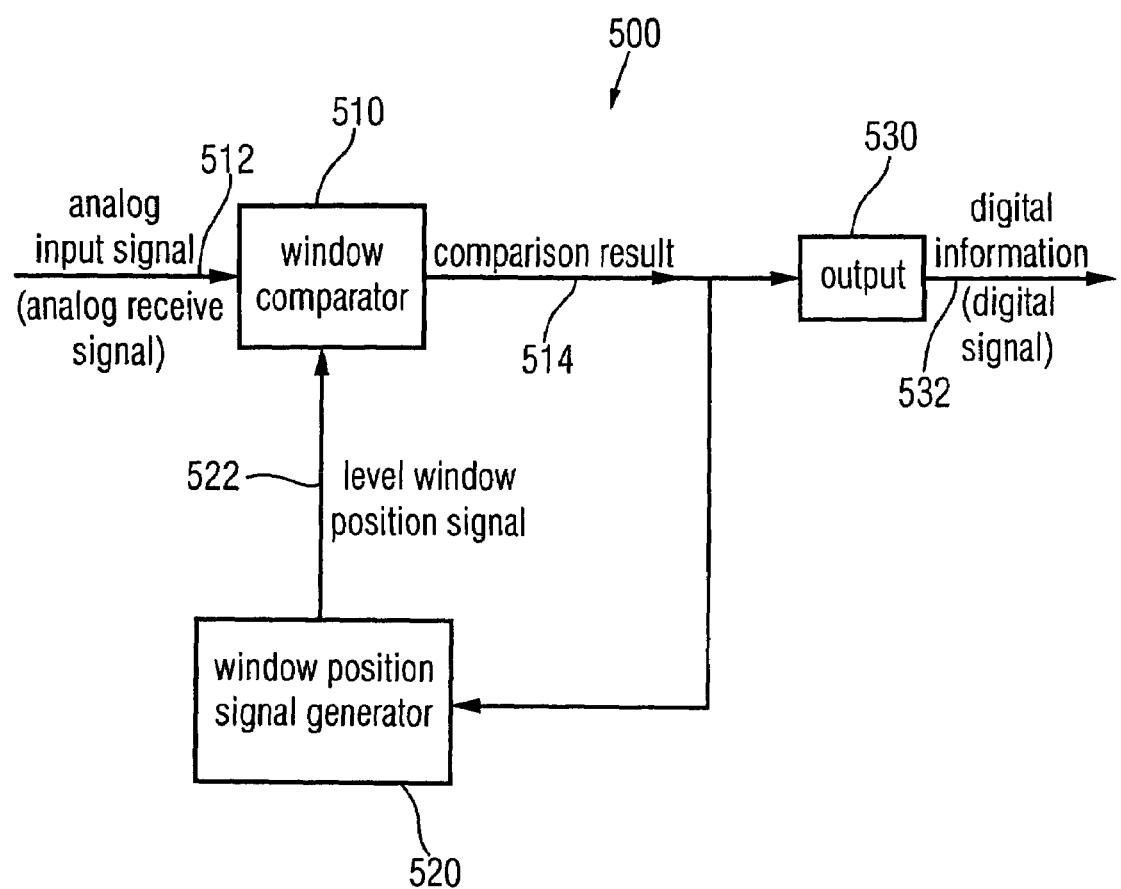
FIG. 5 shows a block schematic diagram of an analog-to-digital converter, for usage in an embodiment of the inventive detector.

FIG. 5 shows a block schematic diagram of an analog-to-digital converter, according to an embodiment of the present invention. The analog-to-digital converter of FIG. 5 is designated in its entirety with 500. The analog-to-digital converter 500 comprises a window comparator 510. The window comparator comprises an input 512 for an analog signal and an output for a comparison result 514 indicating a result of a comparison of the analog input Signal 512 with an upper bound and a lower bound of a level window. The analog-to-digital converter 500 further comprises a level window position signal generator 520. The level window position signal generator 520 comprises an output for a level window position signal 522 adjusting a position of a level window based on the comparison result 514. The analog-to-digital converter further comprises an output 530 for a digital information 532 based on the comparison result 514.

In the following, the functionality of the inventive analog-to-digital converter 500 will be described. It should be noted here that the window comparator 510 uses a level window having an upper bound and a lower bound. Thus, the window comparator 510 receives the analog input signal 512 and provides the comparison result 514, such that the comparison result 514 indicates whether the analog input signal 512 is above the upper bound of the level window, within the level window (i.e. between the upper bound of the level window and the lower bound of the lower window), or below the lower bound of the level window. Thus, the comparison result 514 preferably describes three possibilities.

Accordingly, the level window position signal generator 520 is adapted to adjust the position of the level window in dependence on the three possible states of the comparison result 514. Consequently, the use of the window comparator 514 provides for a flexible way of taking into consideration a relation between a level of the analog input signal 512 and bounds of the level window. Consequently, a special handling can be introduced when the level of the analog input signal 512 is within the level window, (i.e. between the lower bound of the level window and the upper bound of the upper window), as defined by the level window position signal 522. Thus, making use of the window comparator 510, a hard transition between a first state in which the level of the analog signal 512 is below a reference level and a second state in which the level of the analog input signal 512 is above the reference level is avoided. Rather, a state between the lower bound of the level window and the upper bound of the level window is introduced as an intermediate state, resulting in a three-state comparison result 514.

Thus, the analog-to-digital converter as explained with reference to FIG. 5 represents an analog-to-digital converter, where a level window position is adjusted in dependence an a comparison result, the comparison result describing a comparison between bounds of the level window and the analog window signal 514, wherein three states of the comparison result 514 are handled.

Making use of three states, in particular of a state in which the level of the analog input signal 512 is within the level window, brings along the possibility to reduce the number of switching operations when compared to a conventional analog-to-digital converter. This is due to the fact that in the preferred embodiment, the state, during which the analog input signal 512 is within the level window, may be maintained for an extended interval in time, as noise contained within the analog input signal 512 is typically too small to move the analog input signal 512 out of the level window. Thus, according to a preferred embodiment of the present invention, an approximately constant input signal 512 (which may comprise a limited amount of noise or overshoot or undershoot) results in a constant comparison result 514 of the window comparator 510, and consequently in an (at least approximately) constant level window position signal 522. Thus, according to an embodiment, the present invention brings along the possibility of having a level window position signal 522 following a level of the analog input signal 512, wherein a permanent change of the level window position signal 522 is avoided, provided analog signal 512 is approximately constant and remains within the level window.

Figure 6:
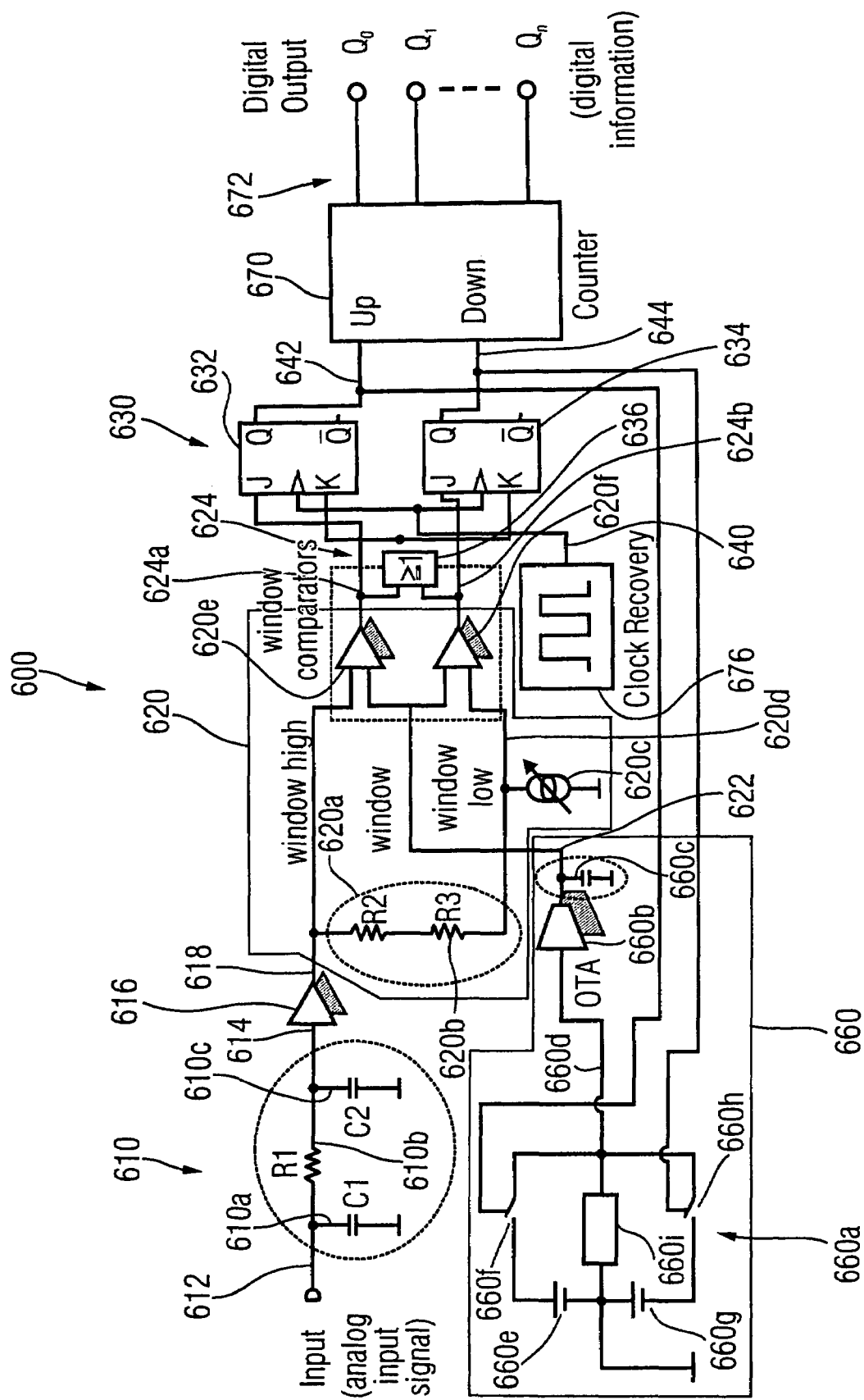
FIG. 6 shows a detailed schematic diagram of an analog-to-digital converter, for usage in an embodiment of the inventive detector.

Further details with respect to an embodiment of the present invention will subsequently be described. For this purpose, FIG. 6 shows a detailed schematic of an inventive analog-to-digital converter, according to an embodiment of the present invention. The analog-to-digital converter of FIG. 6 is designated in its entirety with 600.

The analog-to-digital converter 600 comprises an optional low pass filter 610, which may serve as an anti-aliasing-filter. The low pass filter 610 comprises an input for an analog input signal 612. The low pass filter 610 further comprises an output for a filtered analog input signal 614.

The analog-to-digital converter 600 further comprises and optional amplifier 616 for receiving the filtered analog input signal 614, and for providing an amplified filtered analog input signal 618.

The analog-to-digital converter 600 further comprises a window comparator 620. The window comparator 620 comprises an input for receiving the amplified filtered analog input signal 618. However, in an alternative embodiment, the window comparator 620 may also be adapted to receive the filtered analog input signal 614 (e.g. in the case that the optional amplifier 616 is omitted), or to receive the analog input signal 612 (e.g. in the case that the optional low pass filter 610 is omitted).

The window comparator 620 further comprises an input for a level window position signal 622 for adjusting a position of the level window of the window comparator 620. A generation of the level window position signal 622 will subsequently be described in more detail. The window comparator 620 further comprises an output for a comparison result 624. In an embodiment of the present invention, the comparison result 624 may for example, be provided in the form of two binary signals 624a, 624b. However, any other representation of the comparison result 624 may be chosen, provided that the comparison result 624 indicates whether the level of the input signal of the window comparator 620 is above an upper bound of the level window of the window comparator 620, within the level window of the comparator, (i.e. between a lower bound of the level window and an upper bound of the level window), or below the lower bound of the level window. In other words, the comparison result 624 is a signal having at least three states, as described above.

The analog-to-digital converter 600 further comprises a control logic 630, which in the embodiment of FIG. 6 comprises a first J-K-flip-flop 632, a second J-K flip-flop 634 and a NOR gate 636. The control logic 630 has a first input for receiving the first comparison result signal 624a and a second input for receiving the second comparison result signal 624b. Moreover, the control logic 630 has a clock input for a clock signal 640. Thus, it should be noted that the control logic 630 is a clocked circuit. The control logic 630 further comprises a first output for providing a count-up signal 642 and a second output for providing a count-down signal 644. It should be noted that the count-up signal 642 and the count-down signal 644 may be considered to constitute a countup/count-down information.

The analog-to-digital converter 600 further comprises a level window position generator 660. The level window position signal generator 660 comprises an input for receiving the count-up/count-down information (e.g. the count-up signal 642 and the count-down Signal 644) and an output for providing the level window position signal 622. The output for providing the level window position signal 622 is coupled with a corresponding input of the window comparator 620.

Overall, the level window position signal generator 660 comprises a circuit for providing the level window position signal 622 in dependence on the count-up/count-down information. In other words, the level window position signal generator 660 is adapted to adjust the level window position signal 622 such that the position of the level window follows the level of the input signal of the window comparator 620 (e.g. the signal 618). Thus, the level window position signal generator is adapted to change the level window position signal 622 in response to an activation of the count-up signal 642 into a first direction. Moreover, the level window position signal generator 660 is adapted to change the level window position 622, into a second direction (different from the first direction) in response to the activation of the count-down signal 644.

In a preferred embodiment, the level window position signal generator 660 is adapted to change the level window position signal 622 such that the level window position signal 622 indicates an increased level position of the level window, when the count-up/count-down information indicates that the input signal 618 of the window comparator 620 has a level above the upper bound of the level window. In contrast, the level window position generator 660 is adapted to change the level window position signal 622, such that the level window position signal indicates a decreased level position of the level window, when the count-up/count-down information indicates that a level of the input signal 618 of the window comparator 620 is below a lower bound of the level window.

Moreover, in a preferred embodiment the level window position signal generator 660 is adapted to leave the level window position signal 622 unchanged, if the count-up/ count-down information indicates that the level of the input signal 618 of the window comparator 620 is within the level window (i.e. between the lower bound of the level window and the upper bound of the level window). In this case, the level window position signal generator preferably stores the previous level window position signal 622.

In a preferred embodiment, the analog-to-digital converter 600 further comprises a counter 670. The counter 670 comprises an input for a count-up/count-down information (e.g. for the count-up signal 642 and the count-down signal 644), and further comprises a clock input (not shown). The counter 670 also comprises an output for a count value 672 which is preferably provided in a digital, encoded form, for example in a binary coding. Thus, the count value 672 preferably constitutes the digital information.

It should be noted here, that the counter 670, may for example be adapted to count upwards in response to an edge of the clock signal (not shown), if the count-up signal 642 is active. Moreover, the counter 670 may be adapted to count downwards upon the occurrence of an edge of the clock signal, if the count-down signal 644 is active. Moreover, the counter 670 may be adapted to leave its count value 672 unchanged, if both the count-up signal 642 and the count-down signal 644 are inactive, thus indicating that the input signal 618 of the window comparator 620 is between the lower bound of the level window and the upper bound of the level window.

Overall, it should be noted that the counter 670 is preferably adapted, such that the count value 672 output by the counter 670, follows the position of the level window.

Thus, in a preferred embodiment, the counter 670 is adapted to count in a first direction (e.g. upwards) whenever the level window position signal generator 660 changes the level window position signal 622 in a first level window position change direction (e.g. towards a higher level). Besides, the counter 660 is preferably adapted to count in a second direction (e.g. downwards), whenever the level window position signal generator 660 changes the level of the level window position signal 622 in a second level window position change direction (e.g. towards a lower level). Also, the counter 670 is preferably adapted to leave the count value 672 unchanged, whenever the level window position signal generator 660 leaves the level of the level window position signal 622 unchanged.

Moreover, it should be noted that in a preferred embodiment the counter 670 receives a clock of a same frequency which is used for evaluating the comparison results 624 provided by the window comparator.

The analog-to-digital converter may (optionally) have an input to receive the clock signal 640. Alternatively, the analog-to-digital converter 600 may comprise an internal clock source 676. The internal clock source 676 may in one embodiment be a clock recovery circuit adapted to recover a clock of data symbols contained in the input signal 612, or a multiple of the clock of the data symbols. Alternatively, the clock may be extracted from the carrier signal (or from the frequency of the carrier signal), as the bit rate may be dependent on the carrier frequency, or may be in a predetermined relationship with the carrier frequency. Thus, the frequency of the clock signal 640 may be synchronized with a data clock of data symbols in the input signal 612.

Consequently, the clock signal 640 determines a sampling of the comparison result 624, such that the count-up/count-down information is updated in synchronism with the clock signal 640. Besides, the change of the level window position signal 620 is preferably in synchronism with the clock signal 640, as will be described in more detail in the following.

Subsequently, details of the blocks of the analog-to-digital converter 600 will be described.

Firstly, it should be noted that the low pass filter 610 comprises a π-filter, comprising a first capacitor 610a, a resistor 610b and a second capacitor 610c, connected as shown in FIG. 6.

The window comparator 620 comprises an input for the amplified and filtered analog input signal 618. Moreover, the window comparator comprises a level shifter for producing a level-shifted version of the input signal 618. The level shifter is, for example, implemented by one or more resistors 620a, 620b, which are connected to the input signals. A predetermined current is forced through the resistor 620a and/or resistor 620b making use of a current source 620c. Thus, a level shifted version 620b of the input signal 618 is produced. Moreover, the window comparator 620 comprises a first comparator 620e and a second comparator 620f. The first comparator 620e is adapted to receive the input signal 618 of the window comparator 620 and the level window position signal 622. Moreover, the first comparator 620e is adapted to provide the first comparison result signal 624a (preferably a digital signal) in dependence an whether a level of the input signal 618 of the window comparator 620 is below or above the level of the level window position signal 622. Consequently, the first comparison result signal 624a indicates whether the input signal 618 of the window comparator 620 is below or above a first bound of the level window.

Moreover, the second comparator 640 is adapted to receive as a first input signal, the level shifted version 620d of the input signal 618, and to receive as a second input signal the level window position signal 622. Thus, the second comparator 620f is adapted to produce the second comparison result signal 620d in dependence on whether the level of the level shifted version 620d of the input signal 618 is above or below the level of the level window position signal 622.

In a preferred embodiment of the present invention, the window comparator 620 is adapted to provide a digital signal of logic value "1" at the output of the first comparator 622 and a digital signal of logical value "0", at the output of the second comparator 620f, if the level of the input signal 618 is above the upper bound of the level window. Moreover, if the level of the input signal 618 is within the level window, i.e. if the level of the input signal 618 is above a lower bound of the level window and below an upper bound of the level window, both the first comparison result signal 624a and the second comparison result signal 624b comprise the logical value "0". Besides, if the level of the input signal 618 is below the lower bound of the level window, the first comparison result signal 624a takes the logical value "0" and the second comparison result signal 624 takes the logical value "1".

In the following, the operation of the logic comprising the NOR gate 636 and the J-K-flop-flop 632, 634 will be described. Following the above definition of the logical values of the first comparison result signal 624a and the second comparison result signal 624b, the K-inputs of the J-K flip-flops 632, 634 are active, and the J-inputs of the J-K-flip-flops 632, 634 are inactive when the level of the input signal 618 is within the level window. Consequently, the J-K flip-flops 632, 634 are reset upon an edge of the clock signal 640 under this condition. Thus, if the level of the input signal 618 is within the level window, both the count-up signal 624 and the count-down signal 644 are inactive (comprise a value of logical "0"). As a consequence, when the level of input signal 618 is within the level window, the counter 670 will neither count up nor count down, as soon as the respective information is forwarded to the count-up signal 642 and the count-down signal 644 via the J-K flip-flops 632, 634. Assuming now that the level of the input signal 618 is above the upper bound of the level window, and assuming also that the first comparison result signal 624a is active (logical "1") and the second comparison result signal 624 is inactive (logical "0"), the K-inputs of the J-K-flip-flops 632, 634 are inactive. Moreover, the J-input of the first J-K flip-flop 632 is active and the J-input of the second J-K flip-flop 634 is inactive. Thus, the count-up signal 642 is activated and the count-down signal 644 remains inactive when the level of the input signal 618 is above the upper bound of the level window, as soon as the clock signals 640 is activated. The opposite situation occurs when the level of the input signal 618 is below the lower bound of the level window. In this case, the count-up signal 642 remains inactive, while the count-down signal 644 is activated.

It should be noted here, that it is assumed that there is no immediate transition between a condition in which the level of the input signal 618 is below the level window and a situation in which the level of the input signal 618 is above the level window. In other words, it is assumed that there is always a sequence of the form "level of the input signal 618 below the lower bound of the level window; level of the input signal 618 within the level window; level of the input signal 618 above the level of the level window" or vice-versa.

To summarize the above, there are three possible states of the count-up signals 642 and the count-down signal 644: count-up signal 642 inactive and count-down signal 644 inactive; count-up signal 642 active and count-down signal 644 inactive; count-up signal 642 inactive and count-down signal 644 active.

In a preferred embodiment, a state in which both the count-up signal 642 and the count-down signal 644 are active does not occur. Thus, whenever the counter 670 receives a clock signal (e.g. the clock signal 640), the counter 670 receives a count-up/count-down information (e.g. provided by the count-up signal 642 and the count-down signal 644), instructing the counter to count up, to count down or to leave unchanged the count signal.

In the following, structural details of the level window position signal generator 660 will be discussed. The level window position signal generator 660 comprises a switched voltage source 660a, an operational transimpedance amplifier 660b and a capacitance 660c. The switched voltage source 660a receives the count-up/count-down information and adjusts an input signal 660d of the operational transimpedance amplifier 660b to one out of, for example, three possible voltage levels in dependence of the count-up/count-down information. For this purpose, the switched voltage source 660a comprises, for example, a switch network for connecting the signal 660d either to a first voltage source 660e (e.g. via a first switch 660f), to a second voltage source 660g (e.g. via a second switch 660h) or to a reference potential (e.g. via a resistor 660i). In a preferred embodiment, the first switch 660f is closed when the count-up signal 642 is active, thus pulling the signal 660d to a first voltage level. If the count-down signal 644 is active, the second switch 660h is closed, thus pulling the signal 660d to a second voltage level. If both the count-up signal 642 and the count-down signal 644 are inactive, a resistor 660i pulls the signal 660d to a third voltage level.

The operational transimpedance amplifier 600b, the input of which is connected to the signal 600d, and the output of which is connected to one terminal of the capacitance 600c, is adapted to provide a current for charging the capacitance 600c, when the first voltage level is present at its input, and to provide a current for discharging the capacitance 600c, when the second voltage level is present at its input. Moreover, the operational transimpedance amplifier 600b is adapted to provide a current for leaving the charge of the capacitance 600c unchanged, when the third voltage level is present at its input. For example, the operational transimpedance amplifier 660b is adapted to provide zero current, if the signal 600d provided to its input takes the third voltage level. Alternatively, the operational transimpedance amplifier 660b may be adapted to provide a current balancing leakage currents of the capacitance 660c, when the voltage at its input takes the third voltage level.

Thus, the voltage of the capacitance 660c is increased, kept constant or decreased independence on the count-up/count-down information. It should be noted that the voltage of the capacitance 660c is used to provide the level window position signal 622. In one simplified embodiment, the voltage of the capacitance 660c is directly used as the level window position signal 622. However, circuitry (e.g. amplifiers, buffers, level shifters, and the like) may be present in order to derive the level window position signal from the voltage of the capacitance 660c.

Taking reference to the embodiment of FIG. 6, it should be noted that in a preferred embodiment the state of the switches 660f, 660h remains constant for one period of the clock signal 640, as the count-up signal 642 and the count-down signal 644 are updated only in response to the edge of the clock signal 640. Thus, in the embodiment of FIG. 6, the voltage of the capacitance 660c changes in a fashion approximately linear with time, during a full period of the clock signal 640. However, in another practical embodiment, the logic circuitry 630 and/or the level window position window generator 660 can be adapted such that the voltage of the capacitance 660c changes only for a period of the time which is shorter than the period of the clock signal 640. For example, it may be preferred that the time over which the voltage of the capacitance 660c changes in response of the edge of the clock signal 640 is not longer than half a period of the clock signal 640. In another embodiment, it is preferred that the period of time during which the voltage of the capacitance 660c changes is no longer than 10% of the period time of the clock signal 640. In another preferred embodiment, the time during which the voltage of the capacitance 660c changes is identical to half a period of the clock signal 640, as such a timing can be implemented in a particularly simple way.

Summarizing the above, it can be noted that the analog input signal 622 is increased by a predetermined amount or decreased by a predetermined about in response to the count-up/count-down information. Alternatively, it can be stated that the level of the level window position signal 622 is increased or decreased in response to the comparison result, which is for example, represented by the first comparison result signal 624a and the second comparison result signal 624b.

It should be noted that the control circuitry 630, as provided by the NOR date 636, the first J-K flip-flop 632, and the second J-K flip-flop 634, may be changed according to the specific requirements of the application. Moreover, the mechanism for the generation of the level window position signal 622 on the basis of the comparison result may be changed, as long as it is ensured that the three possible different comparison results (input signal 618 below, within or above the level window) result in different temporal evolutions of the level window position signal 620 (e.g. increasing, decreasing, or remaining unchanged).

Figure 7:
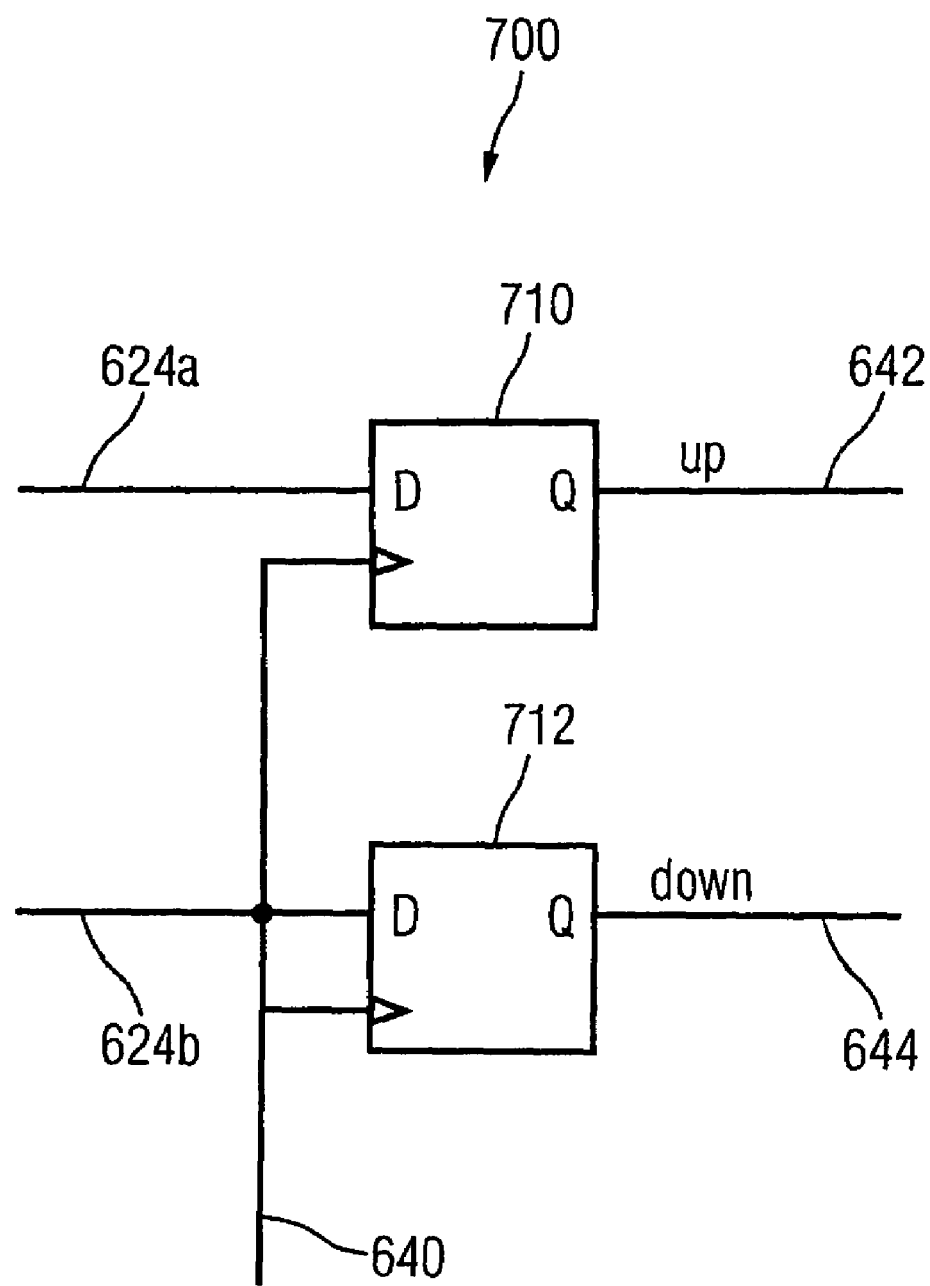
FIG. 7 shows a schematic representation of a data latch, which can be used in an embodiment of the analog-to-digital converter.

In the following, an alternative implementation of a circuit for deriving the count-up signal 642 and the count-down signal 644 on the basis of the first comparison result signal 624a and the second comparison result second comparison result 624b will be described taking reference to FIG. 7. The circuit shown in the schematic diagram of FIG. 7 is designated in its entirety with 700. It should be noted that the circuit 700 may for example replace the NOR gate 636, the first J-K flip-flop 632 and the second J-K flip-flop 634. The circuit 700 comprises a first D-flip-flop 710 and a second D-flop-flop 712. The D-flip-flop 710 receives the first comparison result signal 624a as a data input signal. The second D-flip-flop 712 receives the second comparison result second comparison result 624b as a data input signal. Moreover, both the first D-flip-flop 710 and the second D-flip-flop 712 receive the clock signal 640 as their respective clock signals. Besides, the first D-flip-flop 710 provides as its output signal (Q) the count-up signal 642. The second D-flip-flop 712 provides as its output signal (Q) the count-down signal 644. In other words, the count-up signal 642 is a latched version of the first comparison result signal 624a, and the count-down signal 644 is a latched version of the second comparison result signal 624b.

Figure 7A:
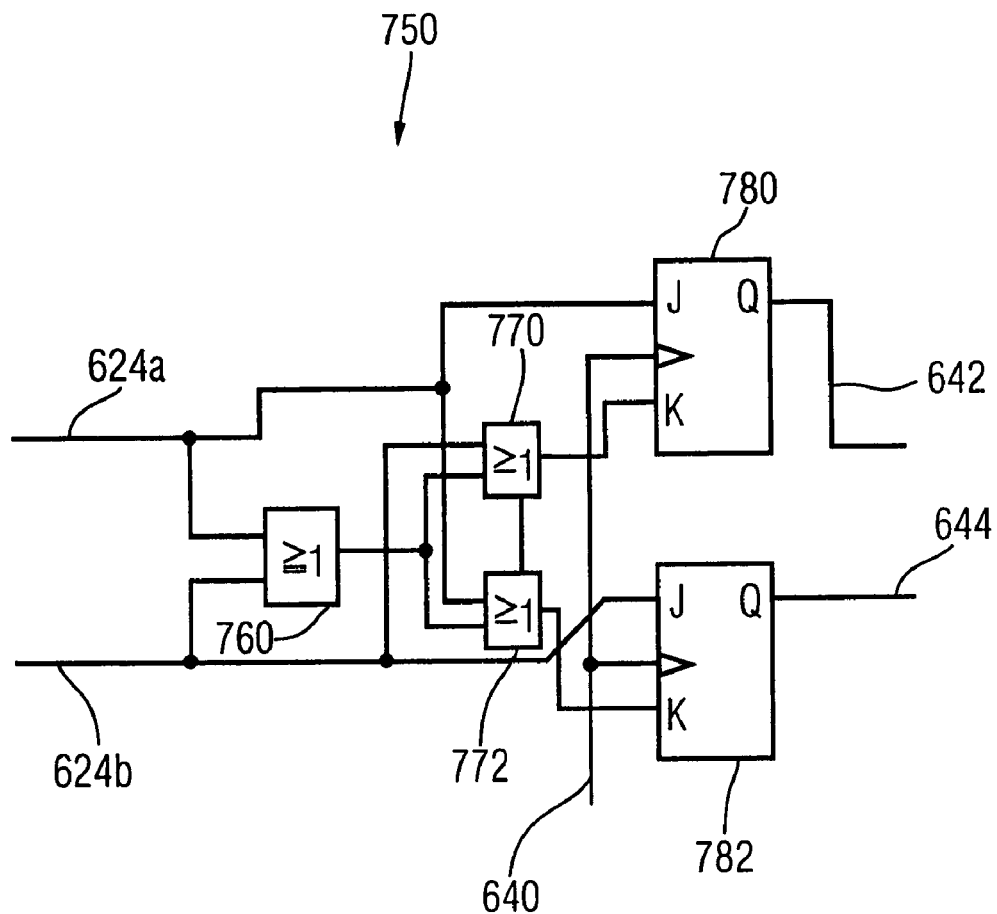
FIG. 7a shows a schematic representation of an alternative data latch which can be used in an embodiment of the analog-to-digital converter.

In the following, another alternative embodiment of a circuit for deriving the count-up signal 642 and the count-down signal 644 on the basis of the first comparison result signal 624a and the second comparison result second comparison result 624b will be described taking reference to FIG. 7a. FIG. 7a shows a schematic diagram of an alternative implementation of the logic circuit 630. The logic circuit of FIG. 7a is designated in its entirety with 750. It should be noted here that same means and signals are designated with the same reference numbers in FIGS. 6, 7 and 7a.

The circuit 750 receives the first comparison result signal 624a and the second comparison result signal 624b. Moreover, the circuit 750 receives the clock signal 640. The circuit 750 is adapted to provide the count-up signal 642 and the count-down signal 644. The circuit 750 comprises a NOR gate 760. The NOR gate 760 receives at its first input the first comparison result signal 624a and at its second input the second comparison result signal 624b.

Moreover, the circuit 750 comprises a first OR gate 770, which receives at a first input the second comparison result signal 624b and at a second input an output signal of the NOR gate 760. A second OR gate 772 receives at its first input the first comparison result signal 624a and at its second input the output signal of the NOR gate 760.

Circuit 750 further comprises a first J-K-flip flop 780 and a second J-K-flip flop 782. A J-input of the first J-K-flip flop 780 receives the first comparison result signal 624a. A K-input of the first J-K-flip flop 780 receives an output signal of the first OR-gate 770. A J-input of the second J-K-flip flop 782 receives the second comparison result signal 624b. A K-input of the J-K-flip flop 782 receives an output signal of the second OR gate 772. Moreover, clock inputs of the first J-K-flip flop 780 and of the second J-K-flip flop 782 both receive the clock signal 640. It should be noted that the first J-K-flip flop 780 provides the count-up signal 642 at its non-inverting output Q. The second J-K-flip flop 782 provides the count-down signal 644 at its non-inverting output Q.

Figure 8:
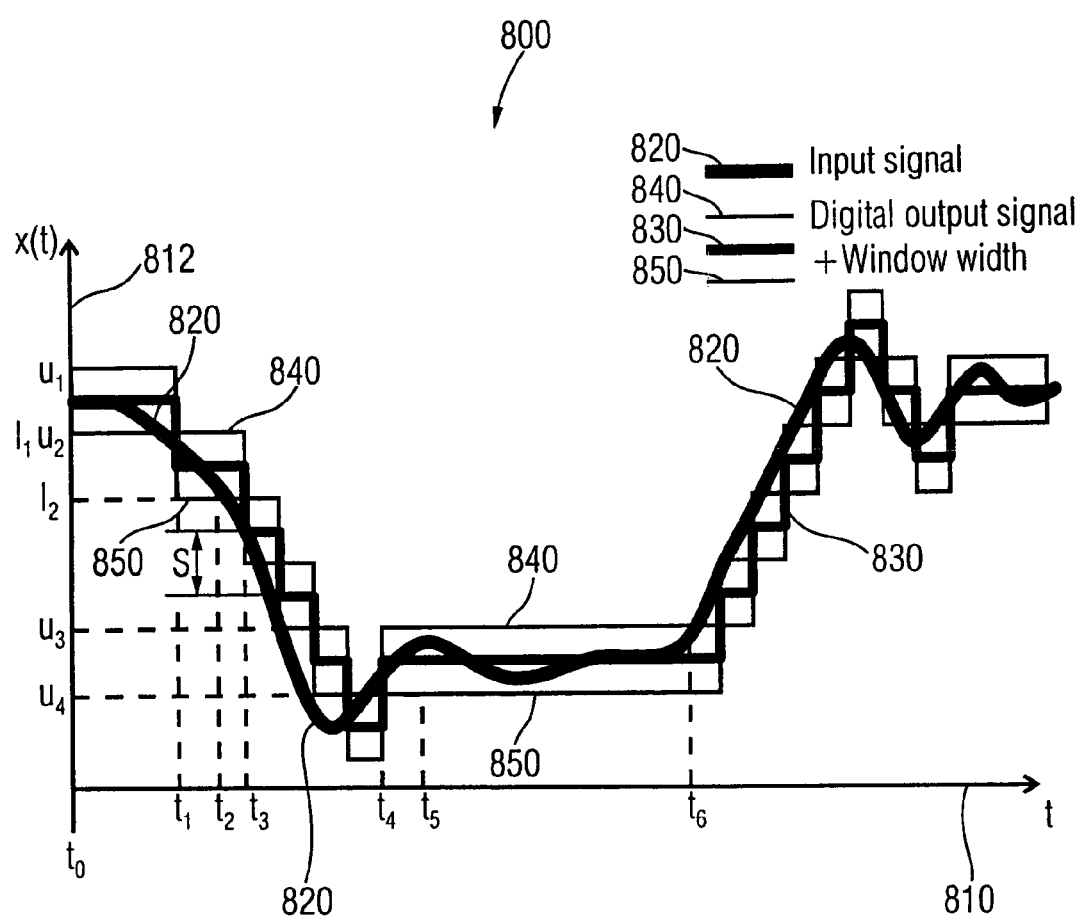
FIG. 8 shows a graphical representation of an input signal and a digital output signal for an analog-to-digital converter according to an embodiment of the present invention.

In the following, the operation of the circuit 600 of FIG. 6 will be described with reference to FIG. 8. FIG. 8 shows a schematic representation of a time evolution of an input signal, a digital output signal and a window width. The graphical representation of FIG. 8 is designated in its entirety with 800. An abscissa 810 represents a time, and an ordinate 812 represents a level of the input signal, a value of the digital output signal and a level of the level window of the window comparator 620.

The time evolution of the input signal (e.g. of the input signal 612, the filtered input signal 614, the amplified and filtered input signal 618, or the analog input signal 512) is represented by a first curve 820 (smooth curve). Moreover, a temporal evolution of a digital output signal, e.g. the counter value 672 or the digital information 532, is represented by a second curve 830 (bold black step curve). It should be noted that the digital output signal changes in predetermined steps, a step size being designated with S. Moreover, a third curve 840 (thin curve) shows a temporal evolution of an upper bound of the level window, and a fourth curve 850 (thin curve) shows a temporal evolution of a lower bound of the level window.

It should be noted that the a graphical representation 800 of FIG. 8, a temporal evolution of the digital output signal 830, a temporal evolution of the upper bound 840 of the level window and a temporal evolution 850 of the lower bound of the level window are shown. However, this is indeed a simplified representation. As can be seen from the circuit 600 of FIG. 6, the level of the level window position signal 620 may be a continuously changing analog value, not comprising any steps. Moreover, as can be seen from the circuit 600 of FIG. 6, the capacitor 666c may explicitly provide limited slope of the level window position signal 622. Moreover, as described above, a level of the level signal 622 may, for example, change in a uniform way (i.e. either increase, decrease or remain unchanged) during a period of the clock signal 640.

However, the control logic 630 and/or the level window position signal generator 660 may be adapted such, that a level of the level window position signal 622 changes only for a part of a period of the clock signal 640, and remains constant for the rest of the period of the clock signal 640. However, it should be noted that in a preferred embodiment a level of the level window position signal 622 corresponds, at least approximately, to the digital output signal.

In FIG. 8, it can be seen that a relation between the level window and an actual value of the input signal is evaluated at the beginning of a clock period of the clock signal. A temporal position of a first beginning of the clock period is designated with $t_1$. A temporal position of a beginning of a second clock period is designated with $t_2$, and a temporal position of a beginning of a third clock period is designated with $t_3$. A lower bound of the level window at a time $t_1$ is designated with $l_1$, and an upper bound of the level window at a time $t_1$ is designated with $u_1$. It can be seen from FIG. 8 that at time $t_1$ the input signal (represented by curve 820) is below the lower bound $l_1$ of the level window. Consequently, the comparison information or comparison result 514, 624 indicates the status. Thus, the digital information 532 or counter value 672 (represented by the second curve 830) is decreased (for example by one step) at time $t_1$. In parallel, the level window is also decreased. The decrease of the level window may for example occur at time $t_1$, or between time $t_1$ and time $t_2$. In the graphical representation of FIG. 8, a change of the position of the level window at time $t_1$ is shown.

A second evaluation of the comparison information or comparison result occurs at time $t_2$. An upper bound $u_2$ of the level window at a time $t_2$ may be identical to a lower bound $l_1$ of the level window at time $t_1$, but does not need to be. Moreover, the lower bound of the level window at position $t_2$ is designated with $l_2$. As can be seen, at time $t_2$ a level of the input signal (represented by curve 820) lies between the upper bound $u_2$ of the level window a time $t_2$ and the lower bound $l_2$ of the level window at time $t_2$. This situation (or relation) is represented by an according comparison result 514 or comparison information 624. As a consequence, the level window is left unchanged between time $t_2$ and time $t_3$ (wherein time $t_2$ and time $t_3$ may, for example, be defined by subsequent edgees of the clock signal 640). It should be noted here that in fact it is not required that the level window is left absolutely unchanged between a time $t_2$ and time $t_3$.

Rather, in one embodiment it is sufficient if the condition holds that the level window is changed by a smaller amount when the comparison information indicates that the input signal lies within the level window than when the comparison result indicates that the level of the input signal lies outside of the level window. In other words, a small change of the level of the level window may occur between the times $t_2$ and $t_3$ (i.e. following time $t_2$) when a level of the input signal lies within the level window.

However, in a preferred embodiment the absolute magnitude of the change of the level of the level window between times $t_2$ and $t_3$ is preferably smaller than an absolute magnitude of the change of the level window between times $t_1$ and $t_2$ (i.e. after a time when the level of the input signal lies outside of the level window).

For the sake of explanation, it should be noted that at time $t_4$ a level of the input signal lies above an upper bound $u_4$ of the level window at a time $t_4$. Thus, the upper bound of the level window is increased to value $u_5$ at time $t_4$, or between times $t_4$ and $t_5$ (i.e. during a period of the clock signal 640 following time $t_4$).

It should also be noted that during a time interval between $t_4$ and $t_6$, the level of the input signal lies within a constant, time-invariant level window, while the actual level of the input signal is varying slightly. However, between time $t_4$ and time $t_6$ the digital output signal remains unchanged, as the level of the input signal never (at least not during edges of the clock signal) exceeds the upper bound 840 of the level window and never falls below the lower bound of the level window. Consequently, both of the bounds of the level window are constant between times $t_4$ and $t6$ (at least between times $t_5$ and $t_6$, if it is assumed that the position of the level window changes between time $t_4$ and $t_5$).

Thus, no change of the digital output signal occurs between times $t_4$ and $t_6$. This is a big advantage of the present invention when compared to conventional analog digital converters making use of comparators, as a change of the digital output signal typical requires a large amount of energy. Some types of circuits (e.g. CMOS circuits) comprise a very low power consumption when a previous state is maintained. Thus, the present invention results in a particularly low power consumption of the output 530 or of the counter 670. Moreover, it can be seen that the level window is constant between times $t_4$ and $t_6$ (or at least between times $t_5$ and $t_6$). A change of the level window typically requires energy (e.g. for charging or discharging capacitor 660c). Leaving the level window unchanged is typical a particularly energy efficient state of operation. Consequently, according to one embodiment of the present invention, the inventive analog-to-digital converter is particularly energy efficient, if the input signal comprises only small changes (cf. the time period between times $t_4$ and $t_6$).

Referring to the overall functionality of the analog-to-digital converter, it should be noted that both the digital output signal and the level window follow the input signal, as can be seen from FIG. 8. However, it should be noted that the digital output signal in a preferred embodiment follows the analog input signal at discrete instances of time (e.g. when edges of the clock signal 640 occur). Also, it should be noted that the digital output signal is a quantized representation of the analog input signal and therefore does not ideally represent the value of the analog input signal. Moreover, the rate) or slope) at which the digital output signal follows the input signal is limited, as can, for example, be seen between times $t_3$ and times $t_4$.

Moreover, it should be noted that the bounds of the level window follow the level of the input signal, though not in an ideal way. Rather, in a preferred embodiment the change of the bounds of the level window is initiated at discrete instance of time (namely when an edge of the clock signal 640 occurs). Besides, the timing, according to which the bounds of the level window follow the level of the input signal is determined by the level window position signal generator 660.

It should be noted that there is an overall tendency of the digital output signal and of the bounds of the level window to follow the input signal, though not in an ideal fashion, as outlined above.

The circuits described with reference to FIGS. 5 and 6 act as an analog-to-digital converter. Consequently, disadvantages of a conventional circuit (namely its insensitivity to small modulation amplitudes or its sensitivity to overshoots) are overcome.

However, when using the analog-to-digital converters 500, 600 of FIGS. 5 and 6, it is preferred to apply a separate digital detection circuit based on a modern digital signal processing algorithm.

Making use of the analog-to-digital converter 500 or 600 (possibly in combination with the digital detection circuit based on a modern digital signal processing algorithm) the following advantages can be obtained:

a) a separation of a demodulation and a detection allows the use of a digital signal processing algorithm, which allows for the application of a sophisticated digital detection algorithm (e.g. a Viterbi-algorithm).

b) the window comparator can be used for overshoot suppression.

c) the window comparator reduces the number of switching operations, and consequently reduces the current consumption.

d) the circuits 500, 600 of FIGS. 5 and 6 can be easily realised using a low-cost CMOS process.

Thus, it can generally be stated that the key idea of the present invention is to construct an adoption of a sigma-delta analog-to-digital converter.

Moreover, it should be noted that the above-described demodulation circuit (comprising, for example, the analog-to-digital converter 500 of FIG. 5, or the analog-to-digital converter 600 of FIG. 6, and, optionally, an additional digital signal processing means) could fully replace a conventional 10%-demodulator, which is sensitive to overshoots and undershoots.

It should be noted that making use of the inventive analog-to-digital converters 500, 600, problems can be overcome which result from using only one analog circuit for demodulation and detection.

It should be noted that a key problem of using only one analog circuit for demodulation detection is the fact that signal redundancy is often lost for a sophisticated detection algorithm. Making use of the inventive analog-to-digital converters 500, 600 only for demodulation, and performing detection using a modern digital processing algorithm (e.g. the Viterbi algorithm) significant improvements when compared to conventional set-ups can be achieved.

Figure 9:
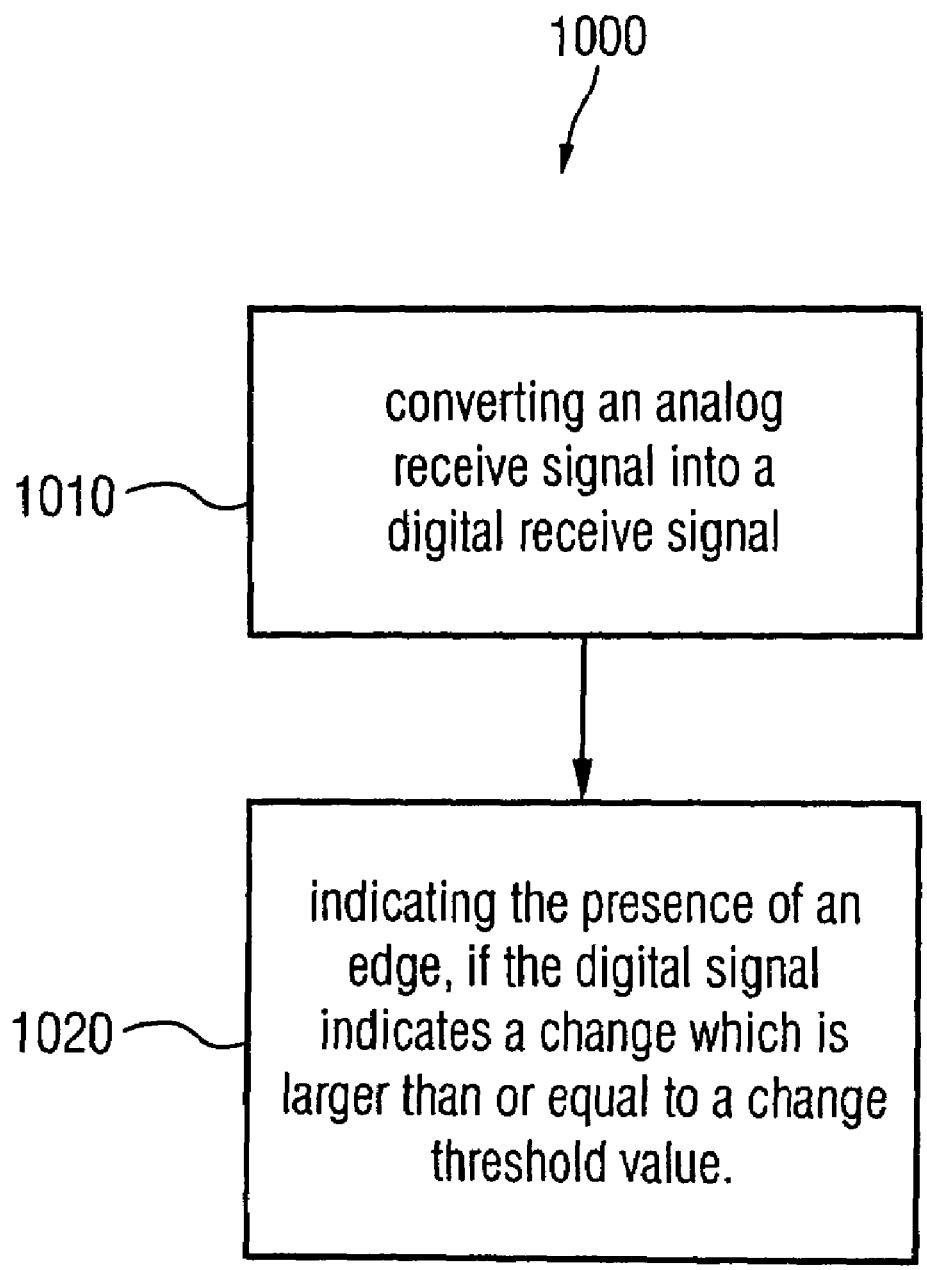
FIG. 9 shows a flowchart of a method for processing a signal, according to an embodiment of the present invention.

FIG. 9 shows a flowchart of a method for processing a signal. The method is designated in its entirety with 1000.

The method 1000 comprises a step 1010 of converting an analog receive signal into a digital signal. The method further comprises a step 1020 of indicating the presence of an edge, if the digital signal indicates a change, which is larger than or equal to a change threshold value.

It should further be noted that the method 1000 can be supplemented by any of the functionalities described with respect to the detector 100, 200.

Figure 10:
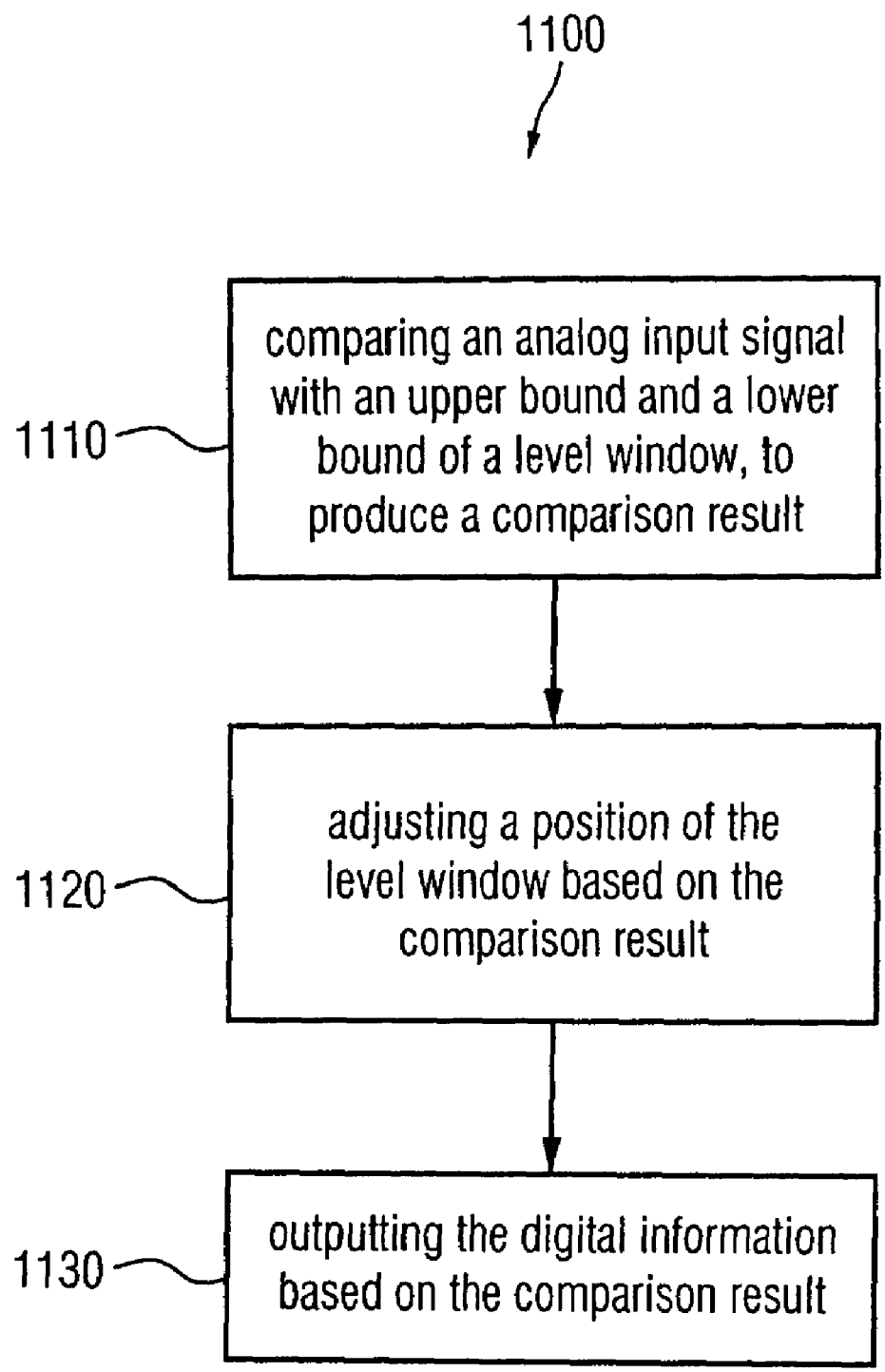
FIG. 10 shows a flowchart of a method for converting an analog input signal into a digital information.

FIG. 10 shows a flowchart of a method for converting an analog input signal into a digital information. The method is designated in its entirety with 1100.

The method 1100 comprises a step 1110 of comparing an analog input signal with an upper bound of a level window and a lower bound of a level window, to produce a comparison result. The method 1100 also comprises a dtep 1120 of adjusting a position of the level window based on the comparison result. Moreover, the method 1100 comprises a step 1130 of outputting the digital information based on the comparison result.

Moreover, the method 1100 can optionally be supplemented by any steps performed by the above described apparatus.

In the following, it will be described how the analog-to-digital converter 500, 600 can be used in combination with the detector 100 and/or the detector 200.

Taking reference to FIG. 1, it can be seen that the edge detector 120 receives a digital signal 114. The digital signal 114 may, for example, be derived from the comparison result 514 of the analog-to-digital converter 500. Moreover, in an alternative embodiment the digital signal 114 may be identical to the comparison result 514. In another alternative embodiment, the digital signal 114 may be identical (or derived from) the digital information 542. It should be noted that depending on the circumstances, the output 530 of the analog-to-digital converter 500 may be omitted, for example if the comparison result 514 is directly used as the digital signal 114.

Alternatively, the analog-to-digital converter 600 of FIG. 6 may be used in the detector 100. In this case, the analog receive signal 112 is equivalent to the analog input signal 612. Depending on which information the edge detector 120 requires, the digital signal 114, the comparison result 624 (e.g. the first comparison result signal 624a and the second comparison result signal 624b) could be fed to the edge detector 120 as the digital signal 114.

Alternatively, the count-up/count-down information (e.g. represented by the count-up signal 624 and the count-down signal 624) may constitute the digital signal 114. In the above-discussed case, the counter 670 may be cancelled. Besides, in an alternative embodiment the count value 672 provided by the counter 670 may serve as the digital signal 114, if the edge detector 120 uses a count value 672 as an input signal.

Taking reference now to detector 200 of FIG. 2, it should be noted that in the detector 200, an analog-to-digital converter 210 is used which provides a count-up signal 232 and a count-down signal 234. It should be noted that the analog-to-digital converter 500 of FIG. 5 may be used as the analog-to-digital converter 210 in the detector 200. In this case, the analog input signal 512 is equivalent to the analog receive signal 212. Moreover, the comparison result 514 may, for example, be used as the count-up signal 232 and the count-down signal 232 (i.e. as the count-up/count-down information 240. In this case, the output 530 may be omitted.

However, the analog-to-digital converter 500 of FIG. 5 may also be adapted to provide the digital information 532 as the count-up information 232 and/or as the count-down information 234.

Besides, the analog-to-digital converter 600 of FIG. 6 may be used as the analog-to-digital converter 210. In this case, the analog receive signal 212 may be used as the analog input signal 612, as the filtered analog input signal 614, or as the amplified and filtered analog input signal 618. Moreover, it is preferred that the count-up signal 642 is used as the count-up signal 232, and that the count-down signal 644 is used as the count-down signal 234. Moreover, if the analog-to-digital converter 600 of FIG. 6 is used at the analog-to-digital converter 210, it is preferred that the counter 670 is omitted. Alternatively, the counter 670 may be adapted to serve as the counter 230, depending on the particular circumstances.

It should further be noted that using the analog-to-digital converter 500 of FIG. 5 or the analog-to-digital converter 600 of FIG. 6 in the detector 100 of FIG. 1 or in the detector 200 of FIG. 2 may result in a particular efficient detector concept.

This is due to the fact that a minimum number of components is required, and also due to the fact that, for example, the counter 670 can be used to realize the functionality of the counter 230. In this way, a particularly efficient detection of an edge can be achieved.

Moreover, it has been described that the analog-to-digital converters 500, 600 of FIGS. 5 and 6 are particularly power efficient, requiring very little power as long as the input signal is at least approximately constant. The same holds, for example, for the edge detector 220 of the detector 200.

Thus, assuming an approximately constant analog receive signal 212, both the analog-to-digital converter 210 and the edge detector 220 are in a static, very low power consumption condition, provided that the analog-to-digital converter 500 or the analog-to-digital converter 600 is used as the analog-to-digital converter 210. Thus, an optimal, minimum power consumption will be achieved.

The invention claimed is:

1. A detector comprising:
an analog-to-digital converter comprising an input for an analog receive signal and an output for a digital signal; and
an edge detector comprising an input operably connected to receive the digital signal and configured to generate edge detection information at an interface, wherein the edge detection information indicates the presence of an edge if the digital signal indicates a change which is larger than or equal to a change threshold value;
wherein the digital signal provided by the analog-to-digital converter comprises count-up/count-down information;
wherein the count-up/count-down information indicates a count-up condition if the analog receive signal processed in a current time interval lies within a higher analog-to-digital converter interval when compared to an analog receive signal processed in a previous time interval;
wherein the count-up/count-down information indicates a count-down condition if the analog receive signal processed in a current time interval lies within a lower analog-to-digital converter interval when compared to an analog receive signal processed in a previous time interval;
wherein the edge detector comprises a counter, the counter comprising a count-up/count-down input coupled with the output of the analog-to-digital converter to receive the count-up/count-down information;
wherein the edge detection information indicates the presence of an edge, when the counter value reaches or exceeds a threshold value,
wherein the counter comprises a reset input for a reset signal; and
wherein the reset signal is active when an edge is detected.

2. The detector of claim 1, when the edge detection information indicates the presence of a rising edge, when the counter reaches or crosses a first threshold value, and
wherein the edge detection information indicates the presence of a falling edge, when the counter value reaches or crosses a second threshold value.

3. The detector of claim 1, wherein the edge detection information indicates the presence of an edge if the digital signal indicates, within a predetermined period of time, a change which is larger than or equal to the change threshold value.

4. The detector of claim 1, wherein the change threshold value specifies a number of analog-to-digital-converter intervals or analog-to-digital converter steps.

5. The detector of claim 1, wherein the detector further comprises a change threshold value calibrator, the change threshold value calibrator comprising a receive signal input for the receive signal and a change threshold value output for the change threshold value, wherein the change threshold value is a predetermined fraction of a difference between a value of the analog receive signal at a first occurrence of a predetermined signal pattern of the analog receive signal, and a value of the analog receive signal at a subsequent occurrence of the predetermined signal pattern of the analog receive signal.

6. The detector of claim 5, wherein the predetermined signal pattern is a start-of-frame-pause comprising a transition of the analog receive signal from a first data value to a second data value.

7. The detector of claim 5, wherein the change threshold value calibrator comprises a pattern detector, the pattern detector comprising an input for the analog receive signal and an output for a pattern detection signal, wherein the pattern detection signal indicates, when a predetermined signal pattern is detected in the analog receive signal; and wherein the change threshold value calibrator comprises a sample unit, the sample unit comprising an input for the receive signal, an input for the pattern detection signal and an output for the change threshold value, wherein the change threshold value is a function of a difference of signal values of the receive signal at two instances of time determined by the pattern detection signal.

8. The detector of claim 1, wherein the detector comprises an edge checker, wherein the edge checker comprises an input for the edge detection information and an output for an error signal, wherein the error signal indicates an error when the edge detection information indicates that two subsequent edges are both rising edges or both falling edges.

9. The detector of claim 1, wherein the detector comprises an edge checker, wherein the edge checker comprises an input for the edge detection information and an output for filtered edge detection information, wherein the filtered edge detection information indicates only edges following a predecessor edge of an opposite edge direction.

10. An apparatus for processing a signal, the apparatus comprising:

means for converting an analog receive signal into a digital signal; and means for detecting a presence of an edge within the digital signal, and for providing edge detection information indicating a presence of an edge, if the digital signal indicates a change which is larger than or equal to a change threshold value;

wherein the means for converting an analog receive signal into a digital signal comprises means for providing count-up/count-down information;

wherein the count-up/count-down information indicates a count-up condition if the analog receive signal processed in a current time interval lies within a higher analog-to-digital converter interval when compared to an analog receive signal processed in a previous time interval;

wherein the count-up/count-down information indicates a count-down condition if the analog receive signal processed in a current time interval lies within a lower analog-to-digital converter interval when compared to an analog receive signal processed in a previous time interval;

wherein the means for detecting a presence of an edge comprises a counting means for counting up or down in response to the count-up/count-down information; and wherein the edge detection information indicates the presence of an edge when a counter value of the counting means reaches or crosses a threshold value;

wherein the counting means comprises a reset input for receiving a reset signal; and wherein the reset signal is active, when an edge is detected.

11. The apparatus of claim 10, wherein the edge detection means comprises an edge identification means for indicating, via the edge detection information, the presence of a rising edge when the counter value reaches or crosses a first threshold value, and for indicating, via the edge detection information, the presence of a falling edge when the counter value reaches or crosses a second threshold value.

12. The apparatus of claim 10, further comprising means for calibrating a change threshold value by providing the change threshold value as a predetermined fraction of a difference between a value of the analog receive signal at a first occurrence of a predetermined signal pattern of the analog receive signal and a value of the analog receive signal at a subsequent occurrence of the predetermined signal pattern of the analog receive signal.

13. The apparatus of claim 12, wherein the means for calibrating a change threshold value comprises means for detecting the predetermined signal pattern within the analog receive signal, and for providing a sample signal upon detection of the predetermined signal pattern within the analog receive signal; and wherein the means for calibrating a change threshold value further comprises means for sampling the analog receive signal at two instances of time in response to the sample signal, to obtain a first sample value and a second sample value, and for providing the change threshold value as a function of a difference of the first sample value and the second sample value.

14. The apparatus of claim 10, further comprising:

means for checking, using the edge detection information, whether two subsequent edges are both rising edges or both falling edges, and for providing an error signal if two subsequent edges are both rising edges or both falling edges.

15. The apparatus of claim 10, further comprising:

edge filtering means for receiving the edge detection information, and for providing filtered edge detection information by suppressing an edge described by the edge detection information which follows a predecessor edge of the same edge direction, and by forwarding, in the filtered edge detection information, an edge described by the edge detection information following a predecessor edge of opposite edge direction.

16. The apparatus of claim 10, wherein the means for converting an analog receive signal into a digital signal comprises:

means for comparing an analog input signal with an upper bound and a lower bound of level window to produce a comparison result;

means for adjusting a position of the level window based on an information derived from the comparison result and indicating, whether the level window should be increased, decreased or maintained; and means for outputting digital information based on the comparison result.

17. The apparatus of claim 16, wherein the means for adjusting the position of the level window comprises means for increasing the position of the level window if the comparison result indicates that the level of the input signal is above the upper bound of the level window, for decreasing the position of the level window if the comparison result indicates that the level of the input signal is below the lower bound of the level window, and for leaving the position of the level window unchanged if the comparison result indicates that the level of the input signal is between the lower bound of the level window and the upper bound of the level window.

18. The apparatus of claim 16, wherein the means for outputting digital information comprises means for counting up and down in dependence on the comparison result and in response to a clock signal, and for outputting a count value as the digital information.

19. The apparatus of claim 16, wherein the count value remains constant when the comparison result indicates that the level of the analog input signal lies between the lower bound and the upper bound.

20. The apparatus of claim 16, wherein the digital information changes in coordination with the position of the level window.

21. The apparatus of claim 16, wherein the means for converting an analog receive signal into a digital signal comprises means for providing an information to adjust the position of the level window in response to a clock signal determining sampling times when the comparison result is processed to update a level window position control signal fed to the means for adjusting a position of the level window.

22. The apparatus of claim 16, wherein the means for adjusting the position of the level window comprises means for performing an analog integration of a signal being dependent on the comparison result, to obtain, as a result of the integration, an analog signal for adjusting the position of the level window.

23. The apparatus of claim 16, wherein the means for converting an analog receive signal into a digital signal further comprises means for low-pass-filtering an external input signal, to obtain the analog input signal as a low-pass-filtered version of the external input signal.

24. The apparatus of claim 16, wherein the means for converting an analog receive signal into a digital signal comprises means for recovering a clock signal being based on a data rate of data symbols comprised in the analog input signal,
  wherein a frequency of the recovered clock signal is at least by a factor of 2 higher than the data rate,
  wherein the means for adjusting the position of the level window comprises means for adjusting the position of the level window in response to the recovered clock signal, and
  wherein the means for outputting the digital information comprises means for updating the digital information in response to the recovered clock signal.

25. A detector, the detector comprising:
  an analog-to-digital converter comprising an input for an analog receive signal and an output for a digital signal, the digital signal comprising count-up/count-down information,
  wherein the count-up/count-down information indicates a count-up condition if the analog receive signal processed in a current time interval lies within a higher analog-to-digital converter interval when compared to an analog receive signal processed in a previous time interval, and
  wherein the count-up/count-down information indicates a count-down condition if the analog receive signal processed in a current time interval lies within a lower analog-to-digital converter interval when compared to an analog receive signal processed in a previous time interval; and
  an edge detector comprising an input for the digital signal and an interface for an edge detection information,
  wherein the edge detection information indicates the presence of an edge, if the digital signal indicates, within a predetermined period of time, a change which is larger than or equal to a change threshold value;
  wherein the edge detector comprises a counter, the counter comprising a count-up/count-down input coupled with the output of the analog-to-digital converter to receive the count-up/count-down information, and a reset input for a reset signal,
  wherein the edge detection information indicates the presence of an edge when the counter reaches or exceed a threshold value, and
  wherein the reset signal is active when an edge is detected.

26. A method for processing a signal, the method comprising steps of:
  converting an analog receive signal into a digital receive signal;
  indicating the presence of an edge if the digital signal indicates a change which is larger than or equal to a change threshold value;
  wherein the converting of the analog receive signal to a digital receive signal comprises providing count-up/count-down information;
  wherein the count-up/count-down information indicates a count-up condition, if the analog receive signal processed in a current time interval lies within a higher analog-to-digital converter interval when compared to an analog receive signal processed in a previous time interval;
  wherein the count-up/count-down information indicates a count-down condition, if the analog receive signal processed in a current time interval lies within a lower analog-to-digital converter interval when compared to an analog receive signal processed in a previous time interval; and
  counting up or down in response to the count-up/count-down information, wherein the counting up or down comprises resetting a counter value when the edge is present.

27. A detector, the detector comprising:
  an analog-to-digital converter comprising an input for an analog receive signal and an output for a digital signal; and
  an edge detector comprising an input for the digital signal and the interface for an edge detection information,
  wherein the edge detection information indicates the presence of an edge, if the digital signal indicates a change which is larger than or equal to a change threshold value,
  wherein the detector further comprises a change threshold value calibrator, the change threshold value calibrator comprising a receive signal input for the receive signal and a change threshold value output for the change threshold value,
  wherein the change threshold value is a predetermined fraction of a difference between a value of the analog receive signal at a first time of a predetermined signal pattern of the analog receive signal, and a value of the analog receive signal at a second time of the predetermined signal pattern of the analog receive signal.

28. A detector, the detector comprising:
an analog-to-digital converter comprising an input for an analog receive signal and an output for a digital signal; and
an edge detector comprising an input for the digital signal and the interface for an edge detection information,
wherein the edge detection information indicates the presence of an edge, if the digital signal indicates a change which is larger than or equal to a change threshold value,
wherein the detector comprises an edge checker,
wherein the edge checker comprises an input for the edge detection information and an output for an error signal,
wherein the error signal indicates an error, when the edge detection information indicates that two subsequent edges are both rising edges or both falling edges.

29. A detector, the detector comprising:
an analog-to-digital converter comprising an input for an analog receive signal and an output for a digital signal; and
an edge detector comprising an input for the digital signal and the interface for an edge detection information,
wherein the edge detection information indicates the presence of an edge, if the digital signal indicates a change which is larger than or equal to a change threshold value,
wherein the detector comprises an edge checker,
wherein the edge checker comprises an input for the edge detection information and an output for a filtered edge detection information,
wherein the filtered edge detection information indicates only edges following a predecessor edge of an opposite edge direction.

* * * * *